(12) United States Patent
Bando et al.

(10) Patent No.: US 11,843,078 B2
(45) Date of Patent: Dec. 12, 2023

(54) LIGHT EMITTING DEVICE WITH GOOD VISIBILITY

(71) Applicant: NICHIA CORPORATION, Anan (JP)

(72) Inventors: Shusaku Bando, Anan (JP); Hirokazu Sasa, Anan (JP)

(73) Assignee: NICHIA CORPORATION, Anan (JP)

( * ) Notice: Subject to any disclaimer, the term of this patent is extended or adjusted under 35 U.S.C. 154(b) by 352 days.

(21) Appl. No.: 17/134,337

(22) Filed: Dec. 26, 2020

(65) Prior Publication Data

US 2021/0202802 A1    Jul. 1, 2021

(30) Foreign Application Priority Data

Dec. 26, 2019  (JP) .................................. 2019-236640

(51) Int. Cl.
*H01L 33/50*    (2010.01)
*H01L 25/075*   (2006.01)
*H01L 33/58*    (2010.01)

(52) U.S. Cl.
CPC ........ *H01L 33/505* (2013.01); *H01L 25/0753* (2013.01); *H01L 33/58* (2013.01);
(Continued)

(58) Field of Classification Search
CPC ............. H01L 33/58; H01L 2933/0041; H01L 2933/0058
See application file for complete search history.

(56) References Cited

U.S. PATENT DOCUMENTS

2007/0147073 A1    6/2007  Sakai et al.
2011/0121731 A1    5/2011  Tsutsumi et al.
(Continued)

FOREIGN PATENT DOCUMENTS

JP    2007188863 A    7/2007
JP    2007227286 A    9/2007
(Continued)

*Primary Examiner* — Jay C Chang
*Assistant Examiner* — Mikka Liu
(74) *Attorney, Agent, or Firm* — HUNTON ANDREWS KURTH LLP

(57) ABSTRACT

The light emitting device includes: at least one light emitting element including a light-extracting surface and at least one lateral surface; a wavelength converting member including; a first upper surface and a second upper surface, a lower surface located at an opposite side from the first upper surface and the second upper surface, at least one first lateral surface connecting the second upper surface and the first upper surface, and at least one second lateral surface connecting the second upper surface and the lower surface, in which a thickness between the lower surface and the first upper surface is smaller than a thickness between the lower surface and the second upper surface, and the first upper surface is located at an opposite side from the light-extracting surface of a corresponding one of the at least one light emitting element, and the lower surface is located facing the light-extracting surface of the corresponding one of the at least one light emitting element; a covering member covering the at least one second lateral surface of the wavelength converting member and the at least one lateral surface of the light emitting element; and a light-shielding film covering the second upper surface of the wavelength converting member.

17 Claims, 27 Drawing Sheets

(52) U.S. Cl.
CPC ............... *H01L 2933/0041* (2013.01); *H01L 2933/0058* (2013.01)

(56) References Cited

U.S. PATENT DOCUMENTS

| | | | |
|---|---|---|---|
| 2012/0305970 A1* | 12/2012 | Kim | ............ H01L 33/504 257/E33.072 |
| 2013/0121009 A1 | 5/2013 | Tsutsumi et al. | |
| 2013/0127331 A1 | 5/2013 | Tsutsumi et al. | |
| 2014/0175491 A1 | 6/2014 | Sanga et al. | |
| 2014/0179029 A1 | 6/2014 | Bhat et al. | |
| 2014/0231843 A1 | 8/2014 | Akimoto et al. | |
| 2015/0102366 A1 | 4/2015 | Wada | |
| 2015/0136306 A1 | 5/2015 | Wakamatsu et al. | |
| 2016/0040857 A1 | 2/2016 | Inoue et al. | |
| 2016/0061391 A1 | 3/2016 | Inoue et al. | |
| 2016/0190418 A1 | 6/2016 | Inomata et al. | |
| 2017/0227176 A1 | 8/2017 | Inoue et al. | |
| 2017/0248281 A1 | 8/2017 | Ozeki | |
| 2017/0294418 A1 | 10/2017 | Edmond et al. | |
| 2018/0095329 A1 | 4/2018 | Shimizu | |
| 2018/0347785 A1 | 12/2018 | Kawaguchi et al. | |
| 2019/0067536 A1 | 2/2019 | Oka et al. | |
| 2019/0103526 A1 | 4/2019 | Miyoshi | |
| 2019/0221550 A1* | 7/2019 | Harada | ............... H01L 25/0753 |

FOREIGN PATENT DOCUMENTS

| | | |
|---|---|---|
| JP | 2008071856 A | 3/2008 |
| JP | 2010238846 A | 10/2010 |
| JP | 2011108589 A | 6/2011 |
| JP | 2012038889 A | 2/2012 |
| JP | 2012104267 A | 5/2012 |
| JP | 2013105877 A | 5/2013 |
| JP | 2014127513 A | 7/2014 |
| JP | 2014153527 A | 8/2014 |
| JP | 2014157991 A | 8/2014 |
| JP | 2014525674 A | 9/2014 |
| JP | 2014197690 A | 10/2014 |
| JP | 2015079805 A | 4/2015 |
| JP | 2015099816 A | 5/2015 |
| JP | 2016031838 A | 3/2016 |
| JP | 2017157610 A | 9/2017 |
| JP | 2018019091 A | 2/2018 |
| JP | 2018092054 A | 6/2018 |
| JP | 2019009429 A | 1/2019 |
| JP | 2019016763 A | 1/2019 |
| JP | 2019041044 A | 3/2019 |
| JP | 2019067905 A | 4/2019 |
| JP | 2019083343 A | 5/2019 |
| JP | 2019514217 A | 5/2019 |
| JP | 2020010063 A | 1/2020 |
| WO | 2014/081042 A1 | 5/2014 |
| WO | 2014/119783 A1 | 8/2014 |
| WO | 2014/123145 A1 | 8/2014 |
| WO | 2015/020205 A1 | 2/2015 |
| WO | 2016/171109 A1 | 10/2016 |
| WO | 2017/038164 A1 | 3/2017 |
| WO | 2018/173913 A1 | 9/2018 |

* cited by examiner

LIGHT EMITTING DEVICE WITH GOOD VISIBILITY

CROSS-REFERENCE TO RELATED PATENT APPLICATION

The present application claims priority under 35 U.S.C. § 119 to Japanese Patent Application No. 2019-236640, filed Dec. 26, 2019, the contents of which are hereby incorporated by reference in their entirety.

BACKGROUND

The present disclosure relates to a light emitting device, a method of manufacturing a wavelength converting member, and a method of manufacturing the light emitting device.

Light emitting devices using light emitting elements are used as vehicle headlights and interior and exterior lighting. For example, described in WO 2014/081042.

SUMMARY

It is an object of certain embodiments of the present disclosure to provide a light emitting device that can provide good visibility, a method of manufacturing a wavelength converting member that can provide good visibility, and a method of manufacturing the light emitting device that can provide good visibility.

A light emitting device according to one embodiment of the present invention includes:
  at least one light emitting element including a light-extracting surface and at least one lateral surface;
  a wavelength converting member including;
    a first upper surface and a second upper surface,
    a lower surface located at an opposite side from the first upper surface and the second upper surface,
    at least one first lateral surface connecting the second upper surface and the first upper surface, and
    at least one second lateral surface connecting the second upper surface and the lower surface, in which
      a first thickness between the lower surface and the first upper surface is smaller than a second thickness between the lower surface and the second upper surface, and
    the first upper surface is located at an opposite side from the light-extracting surface of a corresponding one of the at least one light emitting element, and the lower surface is located facing the light-extracting surface of the corresponding one of the at least one light emitting element;
  a covering member covering the at least one second lateral surface of the wavelength converting member and the at least one lateral surface of the at least one light emitting element; and
  a light-shielding film covering the second upper surface of the wavelength converting member.

A method of manufacturing a plurality of wavelength converting members according to one embodiment of the present invention, the method comprising:
  disposing a plurality of masks having a rectangular shape in a plan view on an upper surface of a wavelength converting substrate;
  singulating the wavelength converting substrate into a plurality of singulated members, each including an upper surface and lateral surfaces, with a predetermined size and a rectangular shape in a plan view such that the upper surface of each of the plurality of singulated members includes one of the plurality of masks and a portion of the wavelength converting substrate;
  aligning a predetermined number of the singulated members and disposing a light-shielding film on the lateral surfaces and the upper surface of each of the singulated members, and on the mask of each of the singulated members;
  removing the masks with portions of the light-shielding film on the masks, while maintaining a portion of the light-shielding film on the upper surfaces of the singulated members at portions surrounding the masks; and
  processing the singulated members whose masks have been removed, the processing comprising reducing a thickness of a portion of each of the singulated members where the mask has been removed to obtain the plurality of wavelength converting members.

A method of manufacturing a plurality of wavelength converting members according to one embodiment of the present invention, the method includes:
  disposing a plurality of masks on an upper surface of a wavelength converting substrate;
  disposing a light-shielding film on portions of the upper surface of the wavelength converting substrate that are not covered by the masks and on upper surfaces of the plurality of masks;
  singulating the wavelength converting substrate into a plurality of singulated members each including an upper surface and lateral surfaces, with a predetermined size and a rectangular shape in a plan view such that the upper surface of each of the plurality of singulated members includes portions corresponding to one of the plurality of masks and a portion of the wavelength converting substrate,
  removing the masks with portions of the light-shielding film on the masks, while maintaining a portion of the light-shielding film on the upper surfaces of the singulated members surrounding the masks; and
  processing the singulated members whose masks have been removed, the processing comprising reducing a thickness of a portion of each of the singulated members where the mask has been removed to obtain the plurality of wavelength converting members.

A method of manufacturing a light emitting device according to one embodiment of the present invention, the method includes:
  providing a wavelength converting member, the wavelength converting member including
    a first upper surface and a second upper surface,
    a lower surface located at an opposite side from the first upper surface and the second upper surface,
    at least one first lateral surface connecting the second upper surface and the first upper surface, and
    at least one second lateral surface connecting the second upper surface and the lower surface, wherein
      a first thickness between the lower surface and the first upper surface is smaller than a second thickness between the lower surface and the second upper surface, and the second upper surface is covered by a light-shielding film;
  bonding the wavelength converting member with at least one light emitting element having a light-extracting surface and lateral surfaces such that the lower surface of the wavelength converting member and the light-extracting surface of the at least one light emitting element face each other; and disposing a covering member on the second upper surface of the wavelength converting member and the lateral surfaces of the at least one light emitting element.

A light emitting device according to one embodiment of the present disclosure can provide good visibility. A method of manufacturing a wavelength converting member and a method of manufacturing the light emitting device (using the wavelength converting member) according to one embodiment of the present disclosure can provide a wavelength converting member and a light emitting device (using the same) that can provide good visibility.

DETAILED DESCRIPTION

Figure 1:
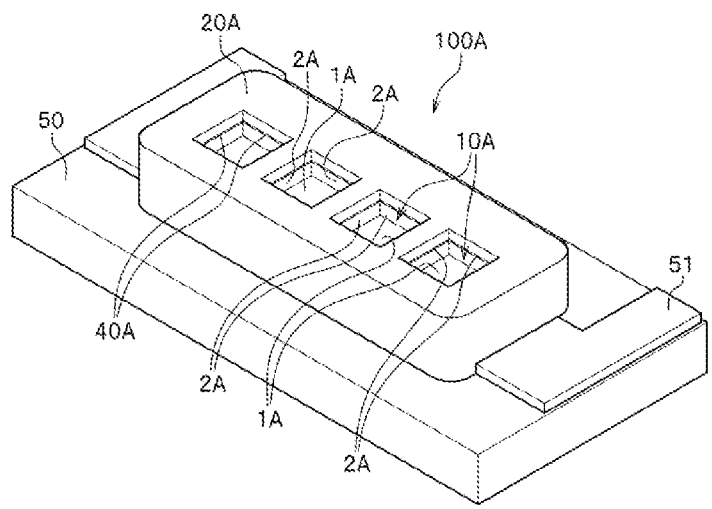
FIG. 1 is a schematic perspective view showing a light emitting device according to a first embodiment.
Figure 2:
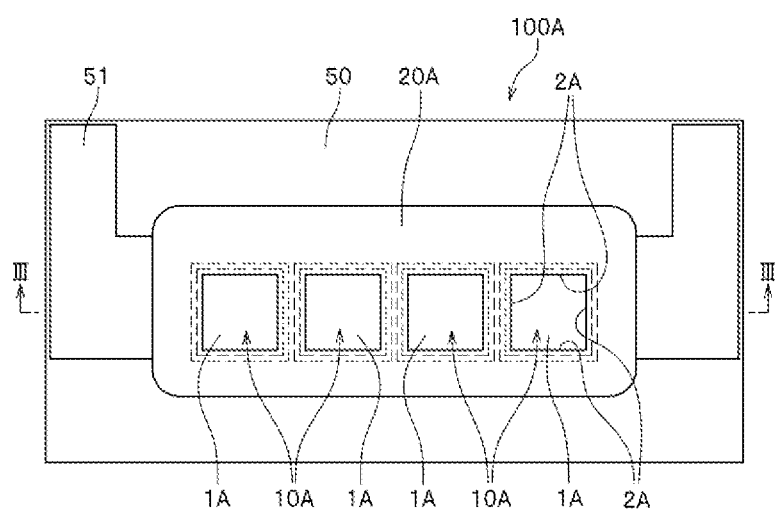
FIG. 2 is a schematic plane view showing the light emitting device according to the first embodiment.
Figure 3:
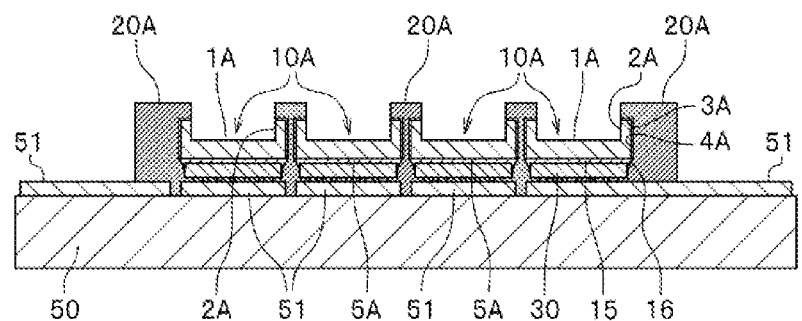
FIG. 3 is a schematic cross-sectional view taken along line III-III of FIG. 2.
Figure 4:
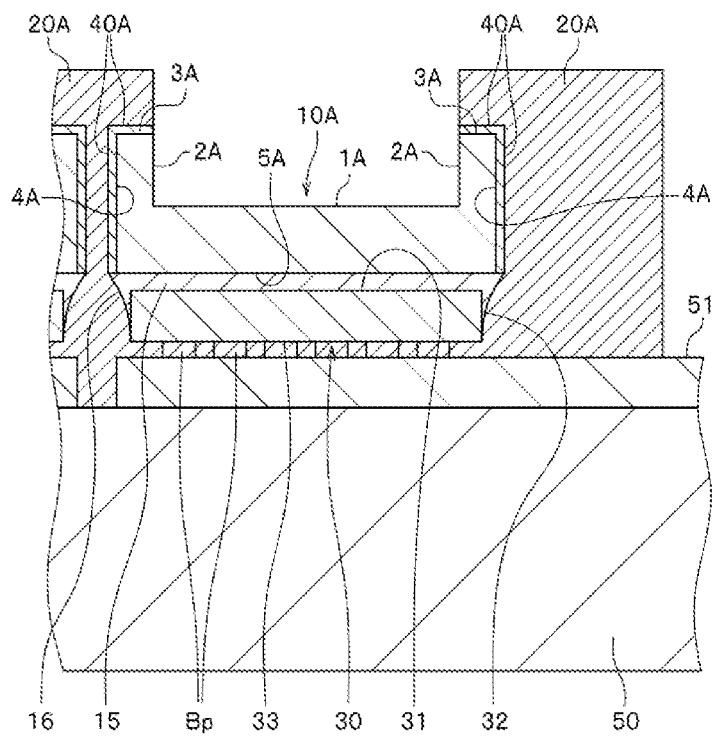
FIG. 4 is a partially enlarged schematic cross-sectional view mainly centering on the wavelength converting member shown in FIG. 3.

Hereinafter, light emitting devices according to various embodiments will be described with reference to accompanying the drawings. The drawings referred to in the description below are to schematically illustrate the embodiments, and the size, a space or interval, locational relationship of the components and so forth be exaggerated or a portion of a component may not be shown. In the description below, the same designations or the same reference numerals denote the same or like members and duplicative descriptions will be appropriately omitted. The directions illustrated in each figure are used to illustrate a relative locational relationship between the components, and are not intended to show absolute positional relationship.

Light Emitting Device and Wavelength Converting Member According to First Embodiment One example of the structure of a light emitting device 100A according to a first embodiment will be described below with reference to FIG. 1 to FIG. 4. The light emitting device 100A includes: a plurality of light emitting elements 30 each including a light extraction surface 31 and lateral surfaces 32; a plurality of wavelength converting members 10A each including; a first upper surface 1A and a second upper surface 3A, a lower surface 5A located at an opposite side from the first upper surface 1A and the second upper surface 3A, first lateral surfaces 2A respectively connecting the second upper surface 3A and the first upper surface 1A, and second lateral surface 4A respectively connecting the second upper surface 3A and the lower surface 5A, in which a first thickness between the lower surface 5A and the first upper surface 1A is smaller than a second thickness between the lower surface 5A and the second upper surface 3A, and the first upper surface 1A is located at an opposite side from the light-extracting surface 31 of a corresponding one of the light emitting elements 30, and the lower surface 5A is located facing the light-extracting surface 31 of the light emitting element 30; a covering member 20A covering the second lateral surfaces 4A of the wavelength converting members 10A, the second upper surface 3A and the lateral surfaces 32 of the light emitting elements 30; and a light-shielding film 40A covering the second upper surface 3A and the second lateral surfaces 4A of each of the wavelength converting members 10A. The light-shielding film 40A is formed continuously on the second upper surface 3A and the second lateral surfaces 4A of the wavelength converting member 10A. Further, the at least one light emitting element 30 is provided with electrodes that are respectively connected to electrically conductive wirings 51 of the substrate 50 through bumps. Each components of the light emitting device 100A will be described below Bp.

Light Emitting Element

At least one light emitting elements 30 is used in the light emitting device 100A. The at least one light emitting element 30 is, for example, mounted in a flip-chip manner on the electrically conductive wirings 51 on the substrate 50 via bumps Bp. The at least one light emitting element 30 has a lower surface 33 provided with positive and negative electrodes, and an upper surface 31 that serves as a light extraction surface 31 located opposite side from the lower surface. For the at least one light emitting element 30 can be selected from known light emitting elements, of those, light emitting diodes or laser diodes are preferable. For the at least one light emitting element 30, any appropriate light emitting element of a desired wavelength can be selected. For example, a light emitting element configured to emit a blue light or a green light, a nitride-based semiconductor ($In_XAl_YGa_{1-X-Y}N$, $0 \leq X$, $0 \leq Y$, $X+Y \leq 1$), GaP, or the like, can be used. For a light emitting element configured to emit a red light, GaAlAs, AlInGaP, or the like, can be used as well as a nitride-based semiconductor element. The at least one light emitting element 30 may be at least one semiconductor light emitting element made of a material other than those described above. According to the purpose and application, the composition, the color of emitting light, the size and the number of light emitting elements 30 can be selected appropriately. When the at least one light emitting element 30 is mounted in a face-up configuration, the surface having the positive and negative electrodes serves as a main light-extraction surface of the at least one light emitting element 30.

Wavelength Converting Member

Hereinafter, a single wavelength converting member 10A will be illustrated. The wavelength converting member 10A is connected to the light extraction surface 31 of a corresponding one of the light emitting elements 30 used in the light emitting device 100A. For example, the wavelength converting member 10A has a rectangular shape in a plan view and a U-shape in a cross-section. The wavelength converting member 10A has a first upper surface 1A, a second upper surface 3A, a lower surface 5A located opposite side from the first upper surface 1A and the second upper surface 3A, a first lateral surface 2A continuous to the second upper surface 3A and the first upper surface 1A, a second lateral surface 4A continuous to the second upper surface 3A and the lower surface 5A. The wavelength converting member 10A has a first thickness between the lower surface 5A and the first upper surface 1A and a second thickness between the lower surface 5A and the second upper surface 3A, the first thickness being smaller than the second thickness. The wavelength converting member 10A is formed with an upward-opening recess defined by the first lateral surfaces 2A and the first upper surface 1A that is an upward-facing surface having a rectangular shape in a plan view. In the first embodiment, the second upper surface 3A has a quadrangular ring shape surrounding the first upper surface 1A in a plan view, with a height different from a height of the first upper surface 1A. In addition, the wavelength conversion material 10A forms the first lateral surface 2A, which is orthogonal to each side of the first upper surface 1A formed in a rectangle and vertically. The light from the at least one light emitting element 30 is extracted from the first upper surface 1A and the first lateral surfaces 2A of the wavelength converting member 10A. The light-shielding film 40A and the covering member 20A disposed on the second upper surface 3A of the wavelength converting member 10 allows obtaining a good visibility.

The second upper surface 3A is formed higher than the first upper surface 1A with respect to the height of the first lateral surfaces 2A, and is formed substantially in parallel to the first upper surface 1A. The second lateral surfaces 4A of the wavelength converting member 10A are substantially orthogonal and continuous to respective outer edges of the second upper surface 3A. The second lateral surfaces 4A are substantially in parallel to the first lateral surfaces 2A. The second lateral surfaces 4A of the wavelength converting member 10A are located at outer side with respect to the lateral surfaces 32 of each of the at least one light emitting element 30 in a plan view. The formation of the second lateral surfaces 4A substantially orthogonal to the lower surface 5A allows a decrease in rising of an adhesive material 15, which is used to adhere the wavelength converting member 10A and the at least one light emitting element 30, onto the second lateral surfaces 4A, in manufacturing of the light emitting device 100A. With the decrease in the rising of the adhesive 15 onto the second lateral surfaces 4A, allows for a reduction of light that is a portion of light emitted from the light emitting element 30 and leaking outside without passing through the wavelength conversion component 10A.

Further, the wavelength converting member 10A has the lower surface 5A substantially orthogonal and continuous to lower edges of the second lateral surfaces 4A. The lower surface 5A is the surface to be arranged facing and connected to the light extraction surface 31 of the at least one light emitting element 30. The lower surface 5A is the surface where light from the at least one light emitting element 30 of the light emitting device 100A enters. The lower surface 5A has an area dimension greater than a sum of area dimensions of the light extraction surfaces of the at least one light emitting element 30. In other words, the lower surface 5A is formed such that when a single light emitting element 30 is used, the area dimension of the lower surface 5A is greater than the area dimension of the light extraction surface 31 of the single light emitting element 30, and when more than one light emitting elements 30 are used, the area dimension of the lower surface 5A is greater than a sum of the area dimensions of the light extraction surfaces 31 of the light emitting elements 30. Further, the lower surface 5A is formed substantially flat. Forming the lower surface 5A of the wavelength converting member 10A with an area dimension greater than an area dimension of the light extraction surface of a single light emitting element 30 or than a sum of area dimensions of the light extraction surfaces of the light emitting elements 30 allows light emitting from a single or from more than one light emitting elements 30 made incident on the wavelength converting member 10A without loss. The lower surface 5A of the wavelength converting member 10A preferably has an area dimension, for example, in a range of 1.1 to 15 times greater than the sum of area dimensions of the light extraction surfaces 31 of the at least one light emitting element 30 connected to the lower surface 5A. Also, the wavelength converting member 10A has a thickness of, for example, in a range of 60 to 300 µm at a location between the second upper surface 3A and the lower surface 5A. Further, the wavelength converting member 10A has a thickness of, for example, in a range of about 10 to 90% with respect to a thickness at a location between the first upper surface 1A and the lower surface 5A.

It is preferable that the first upper surface 1A of the wavelength converting member 10A has an area dimension smaller than a sum of area dimensions of the light extraction surfaces 31 of the at least one light emitting element 30, and also smaller than the area dimension of the lower surface 5A of the wavelength converting member 10A. With this arrangement, the emitted light from the light emitting element 30 is concentrated on the first upper surface 1A or the first lateral surfaces 2A of the wavelength converting member 10A. The wavelength converting member 10A can be made of a resin material that contains a fluorescent material. Specific examples of the fluorescent material used for the wavelength converting member 10A include silicone resin, epoxy resin, phenol resin, polycarbonate resin, acrylic resin, TPX resin, polynorbornene resin, or modified resin thereof or hybrid resin thereof. Among those, it is preferable to include silicone resin, which has good heat resistance and electrical insulation, and is flexible. The wavelength converting member 10A may be made of a light-transmissive material having a fluorescent material disposed on its upper surface, for example.

The fluorescent materials used in the field can be selected appropriately as the fluorescent materials used in the wavelength converting member 10A. Examples of the fluorescent materials that can be excited by a blue or ultraviolet light emitting element include yttrium aluminum garnet-based fluorescent materials activated with cerium (YAG:Ce), lutetium aluminum garnet-based fluorescent materials activated with cerium (LAG:Ce), nitrogen-containing calcium aluminosilicate-based fluorescent material activated with europium and/or chromium ($CaO—Al_2O_3—SiO_2$:Eu, Cr), silicate-based fluorescent material activated europium (($Sr, Ba)_2SiO_4$:Eu), nitride-based fluorescent materials such as β-sialon fluorescent materials, CASN fluorescent materials ($CaAlSiN_3$:Eu), SCASN fluorescent materials (Sr, Ca)$AlSiN_3$:Eu), and KSF-based fluorescent materials ($K_2SiF_6$:Mn), sulfide-based fluorescent materials, and quantum dot fluorescent materials.

Further, the wavelength converting member 10A may contain a light diffusing material. Examples of the light diffusing material include titanium oxide, barium titanate, aluminum oxide, and silicon oxide. The fluorescent material in the wavelength converting member 10A may be dispersed throughout the wavelength converting member 10A, or may be mainly distributed near the upper surface or near the lower surface of the wavelength converting member 10A. With a combination of one or more of the fluorescent materials described above and a blue light emitting element or an ultraviolet light emitting element, light emitting devices of various emission colors (for example, a light emitting device to emit a white light) can be manufactured. When the light emitting device 100A is configured to emit a white light, the light emitted from the light emitting device 100A can be adjusted to have a white color by the type and the concentration of the fluorescent material contained in the wavelength converting member 10A. The concentration of the fluorescent material contained in the light-transmissive member used in the wavelength converting member 10A can be, for example, 5 mass % or greater.

Alternatively, a light emitting device configured to emit a red light can be obtained by using a blue light emitting element for the light emitting element 30, and a nitride-based semiconductor fluorescent material to emit light with high red component. Further, a light emitting device configured to emit light having an amber color can be obtained by using a blue light emitting element for the light emitting element 30, and a YAG-based fluorescent material and a nitride-based fluorescent material to emit light with high red component. The color amber is located on the color diagram in a range of long-wavelength region in the yellow color and short-wavelength region of yellow-red color in JIS standard Z8110, and in a range between the yellow color and the short-wavelength region of yellow-red color in JIS standard Z9101 that defines safety colors. For example, light of an amber color has a dominant wavelength in a range between 580 and 600 nm. Many fluorescent materials to emit red or amber color have low light converting efficiencies, and it is preferable to increase the concentration of the fluorescent material to obtain a desired color. When a light emitting device is configured to emit light of a red or amber color, the concentration of the fluorescent material contained in the light-transmissive member used in the wavelength converting member 10A can be in a range of about 60 to 80 mass %, for example.

Adhesive Material 15

The at least one light emitting element 30 and the wavelength converting member 10A can be connected via an adhesive material 15. The adhesive material 15 is disposed on the upper surface that is the light extraction surface of the at least one light emitting element 30, and continuously onto at least portions of the lateral surfaces of each of the at least one light emitting element 30. The adhesive material 15 is disposed such that the adhesive material 15 is located between the covering member 20A and the lateral surfaces of each of the at least one light emitting element 30, and the upper surface of the adhesive material 15 is in contact with the lower surface 5A of the wavelength converting member 10A. It is preferable that the adhesive material 15 is disposed on the upper surface of each of the at least one light emitting element 30 continuously onto the lateral surfaces 32 to create a fillet 16 between the lower surface 5A of the wavelength converting member 10A and the lateral surfaces of each of the one or more light emitting element 30.

It is preferable that the fillet 16 is in contact with the lower surface 5A of the wavelength converting member 10A and the lateral surfaces of each of the at least one light emitting element 30, with a shape concavely curved with respect to the covering member 20A. With the shape as described above, light emitted from each of the at least one light emitting element 30 can be reflected by the surfaces (interfaces between the fillet and the covering member 20A) of the fillet of the adhesive material 15, facilitating the light emitted from the at least one light emitting element 30 guided into the wavelength converting material 10A. It is preferable that the adhesive material 15 is a light-transmissive material that can transmit light emitted from each of the at least one light emitting element 30 to the wavelength converting member 10A. Examples of the adhesive material 15 include known adhesive materials made of epoxy resin or silicone resin, organic adhesive materials having high refractive indexes, inorganic adhesive materials, and adhesive materials made from low melting point glass. The wavelength converting member 10A and the at least one light emitting element 30 may be connected by compression bonding etc., without the use of the adhesive material 15. When the wavelength converting member 10A and the at least one light emitting element 30 are connected without the use of adhesive material 15, for example, a room-temperature bonding such as a surface activation bonding, an atomic diffusion bonding, or the like can be used. Such a room-temperature bonding can be performed without applying an adhesive material, heat, etc., such that there is no need to consider a difference in the thermal expansion coefficients between the two members to be bonded, and a firm bonding can be achieved. When an atomic diffusion bonding is used, atomic-level bonding is achieved, which allows for a stronger and more durable bonding than bonding with the use of adhesive materials etc. Moreover, heating is not performed and thus raising or lowering of the temperature is not required, such that it becomes possible to perform bonding in a short time.

Light-Shielding Film

The light-shielding film 40A is disposed on the second upper surface 3A and the second lateral surfaces 4A of the wavelength converting member 10A and is configured to shield or reflect light that would otherwise propagate through the second upper surface 3A and the second lateral surfaces 4A toward the outside. It is preferable that the light-shielding film 40A is made of a material that can shield or reflect at least 80% of the light passing through the second upper surface 3A and the second lateral surfaces 4A. For the light-shielding film 40A, a single layer of metal, a multilayer film of metal, or a multilayer film of two or more dielectric materials (dielectric multilayer film) can be used. Examples of dielectric multilayer film include a distributed Bragg reflector (DBR) film. For the light-shielding film 40A, a film containing a dielectric multilayer film can be preferably used. Compared to a metal or the like, a dielectric multilayer film absorbs less light from a light-transmissive member, and can reflect light more efficiently. When both a metal film and a dielectric multilayer film are used as a light-shielding film 40A, it is preferable to dispose the dielectric multilayer film and the metal film in this order on the second upper surface 3A and the second lateral surfaces 4A.

Examples of the metal or metals used as a light-shielding film 40A include gold, silver, copper, iron, nickel, chrome, aluminum, titanium, tantalum, tungsten, cobalt, ruthenium, tin, zinc, lead or an alloy or alloys of those. For example, examples of aluminum alloys include alloys of Al and Cu, Ag, a platinum-group metal(s) such as Pt, etc. Examples of dielectric substance(s) used as the light-shielding film 40A include an oxide or a nitride of at least one element selected from the group consisting of Si, Ti, Zr, Nb, Ta, and Al. In the dielectric multilayer film constituting a DBR film, it is generally preferable that when a first dielectric has a refractive index n1 and a thickness d1, a second dielectric has a refractive index n2 and a thickness d2, and the light-emitting layer emits light of a wavelength $\lambda$, d1 and d2 respectively satisfy $d1=\lambda/(4 \times n1)$ and $d2=\lambda/(4 \times n2)$.

The thickness of the light-shielding film 40A can be, for example, in a range of about several tenths of a micrometer to about several tens of micrometers, preferably in a range of about 0.1 to about 10 μm, more preferably about 0.3 to about 7 μm. With the thickness of the light-shielding film 40A equal to or greater than the lower limit value, the light-shielding film 40A can be formed more uniformly, which allows for reliable reflection of light. With the thickness of the light-shielding film 40A equal to or less than the higher limit value, uneven emission caused by the light-shielding film 40A can be reduced or prevented.

Covering Member

The covering member 20A is configured to reflect light propagating toward other than the first upper surface 1A and the first lateral surfaces 2A of the wavelength converting member 10A to exit from the first upper surface 1A and the first lateral surfaces 2A of the wavelength converting member 10A, and also is configured to cover the lateral surfaces of each of the at least one light emitting element 30 to protect the at least one light emitting element 30 from external forces, dust, gases, etc. The covering member 20A is disposed to expose the first upper surface 1A and the first lateral surfaces 2A of the wavelength converting member 10A such that those surfaces can serve as the light-emitting surfaces of the light emitting device 100A, and to cover portions of the wavelength conversion materials 10A, at least one light emitting element 30, and portions of the upper surface of the substrate 50. More specifically, the covering member 20A is disposed to cover the second upper surfaces 3A and the second lateral surfaces 4A of the wavelength converting members 10A via the light-shielding films 40A. Further, the light-shielding film 40A covers the lateral surfaces 32 of each of the at least one light emitting element 30 via the adhesive material 15, and also covers portions of the lower surface 33 of each of the at least one light emitting element 30 and portions of the upper surface of the substrate 50.

The light extraction surface 31 of each of the at least one light emitting element 30 is connected to the lower surface 5A of a corresponding one of the wavelength converting members 10A, such that the light extraction surface 31 of each of the at least one light emitting element 30 is not covered by the covering member 20A, which allows light emitted from the at least one light emitting element 30 can enter the wavelength converting members 10A. The covering member 20A is made of a material that can reflect light emitted from the at least one light emitting element 30, such that light from the at least one light emitting element 30 that is transmitted through the light-shielding film 40A can be reflected at the interfaces between the light-shielding film 40A and the covering member 20A into the corresponding one of the wavelength converting members 10A. Alternatively, light transmitted through the fillet 16 at the lateral surfaces of each of the at least one light emitting element 30 can be reflected at the interfaces between the fillet 16 and the covering member 20A into the corresponding one of the wavelength converting members 10A. As described above, light emitted from each of the at least one light emitting element 30 is reflected by the light-shielding film 40A or the covering member 20A and propagate through the corresponding one of the wavelength converting member 10A, and is emitted to the outside from the first upper surfaces 1A and the first lateral surfaces 2A that are the light-emitting surfaces of the light emitting device 100A. The covering member 20A is configured to reflect light transmitted through the light-shielding films 40A to light-emitting surface sides of the light emitting device 100A. In addition, when the covering member 20A is disposed between each of the at least one light emitting element 30 and the substrate 50, the covering member 20A is preferably made of a material having a low linear expansion coefficient, which allows a reduction of thermal stress at the portions where the at least one light emitting element 30 and the substrate 50 are connected.

The covering member 20A can be formed by containing a light-reflective material in a base material made of silicone resin, modified silicone resin, epoxy resin, modified epoxy resin, acrylic resin, or hybrid resin containing at least one type of those resin. Examples of the light-reflecting materials includes titanium oxide, silicon oxide, zirconium oxide, yttrium oxide, yttria-stabilized zirconia, potassium titanate, alumina, aluminum nitride, boron nitride, and mullite. Because the amount of light reflected and transmitted in the covering member 20A depends on the concentration and density of the light-reflective material, the concentration and density of the light-reflective material is adjusted according to the shape and size of the light emitting device 100A. In addition, when the covering member 20A is made of a material having light reflectivity and heat dissipating properties, heat dissipation and light reflectivity can be improved. Examples of such materials include aluminum nitride and boron nitride having high thermal conductivity. For the convenience of illustration, the covering member 20A in FIG. 3 and FIG. 4 has angular corners, but the corners of the covering member 20A may be rounded.

Substrate

The substrate 50 is configured to mount at least one light emitting element 30 and to electrically connect the light emitting device 100A to the outside. The substrate 50 includes a plate-like support member having an upper surface and electrically conductive wirings 51 are disposed on the upper surface and/or inside of the support member. The structure of the electrically conductive wirings 51 of the substrate 50 are determined according to the number of the at least one light emitting element 30, the configuration and size of the electrodes of the at least one light emitting element 30. The substrate 50 may also be configured with a terminal for heat dissipation that is electrically independent of the light emitting element 30, on the lower surface of the substrate 50. It is preferable that the terminal for heat dissipation is formed to have an area dimension larger than a sum of the area dimensions of the upper surfaces of the at least one light emitting element 30 of light emitting device 100A, and is disposed to overlap the area(s) directly below the at least one light emitting element 30. With the configuration of the terminal for heat dissipation as described above, heat dissipation performance of the light-emitting device 100A can be further improved.

The supporting member of the substrate 50 is preferably made of an electrically insulating material, which is also preferably a material hardly transmit light emitted from the at least one light emitting element 30 and external light. The substrate 50 may be made of a material with some degree of mechanical strength or of a material used for a flexible substrate. Examples of such materials include ceramics such as alumina, aluminum nitride, and mullite, resins such as phenol resins, epoxy resins, polyimide resins, bismaleimide-triazine (BT) resins, and polyphthalamide (PPA) resins. The supporting member can also have a structure with a cavity. This configuration can facilitate formation of the covering member 20A, such as applying the material of the covering member 20A by potting and then harden it. The electrically conductive wirings and the terminal for heat dissipation can be made of, for example, one or more metals such as Cu, Ag, Au, Al, Pt, Ti, W, Pd, Fe, and Ni, or an alloy containing one or more such metals. The electrically conductive wirings 51 can be formed by using, for example, electrolytic plating, electroless plating, vapor deposition, or sputtering.

The light emitting device 100A has the configuration described above, so that when used for headlamps of motorcycles, automobiles, etc., or as light sources for ships or aircrafts, for example, the light emitted from the at least one light emitting element 30 can be irradiated to further distance. In the light emitting device 100A, when light is emitted from the at least one light emitting element 30, a portion of the emitted light propagates in the wavelength converting member 10A without being reflected by the covering member 20A and directly leaches the first upper surface 1A and the first lateral surfaces 2A, and a portion of the emitted light is reflected by the light-shielding film 40A or the covering member 20A and comes out of the first upper surface 1A and the first lateral surfaces 2A. In the light emitting device 100A, the first upper surface 1A and the first lateral surfaces 2A of the wavelength converting member 10A are located inward of the second upper surface 3A, allowing light extracted to the outside for provide good visibility. This makes it possible to achieve a 100A light emitting device with high luminance and good visibility in longer distance, suitable for use in high beam headlamps, for example.

Method of Manufacturing Wavelength Converting Member and Light Emitting Device

Next, a method of manufacturing the wavelength converting member for use in the light emitting device 100A illustrated in a flowchart in FIG. 5A will be described with reference mainly to FIG. 5B and FIG. 5C to FIG. 5J and FIG. 5K. The method of manufacturing the wavelength converting member includes disposing masks S11 in which a plurality masks having a rectangular shape in a plan view are disposed on the upper surface of the wavelength converting substrate, singulating S12 in which the wavelength converting substrate with the masks disposed thereon is singulated into singulated members each having a rectangular shape in a plan view of a predetermined size, with exposing a portion of the wavelength converting member, disposing a light-shielding film S13, in which singulated wavelength converting members are aligned in a matrix and a light-shielding film is disposed on lateral surfaces and the upper surfaces of the wavelength converting members and on the masks, removing the masks S14, in which, while retaining portions of the light-shielding film located on the upper surfaces of the wavelength converting members surrounding outer peripheries of the masks, and processing S15, in which, after removing the masks, thicknesses of the portions of the wavelength members are reduced.

Disposing Mask

Figure 5A:
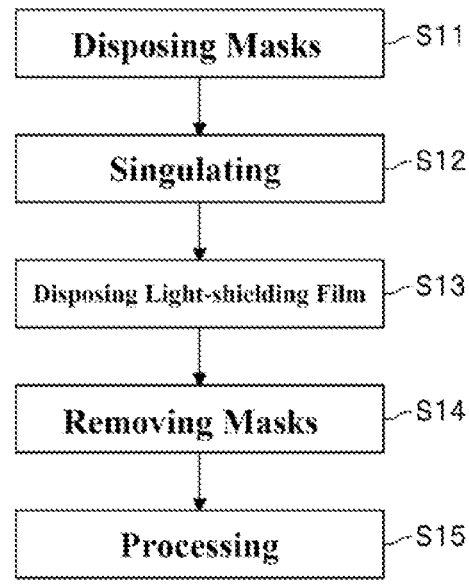
FIG. 5A is a flowchart illustrating a method of manufacturing a wavelength converting member for use in the light emitting device according to the first embodiment.
Figure 5B:
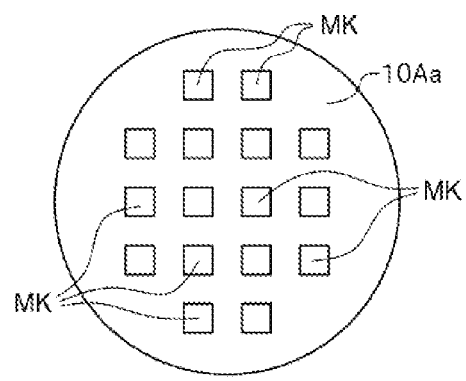
FIG. 5B is a schematic plan view illustrating disposing a plurality of masks in the method of manufacturing a wavelength converting member according to one embodiment of the present disclosure.
Figure 5C:
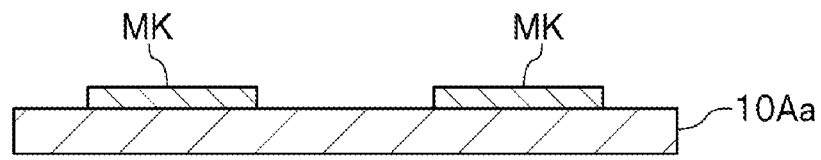
FIG. 5C is a schematic cross-sectional view illustrating a state in which the plurality of masks have been disposed in the disposing a mask.

As shown in FIG. 5A, FIG. 5B, and FIG. 5C, disposing the masks S11 is performed. In the disposing masks S11, a plurality of masks MK having a rectangular shape in a plan view are disposed on the upper surface of the wavelength converting substrate 10Aa. The wavelength converting substrate 10Aa may be in, for example, a disk shape in a plan view and configured to be singulated into the wavelength converting members 10A. The wavelength converting substrate 10Aa can be made of a resin material containing a fluorescent material. The masks MK can be disposed, for example, disposing a mask sheet on the entire upper surface of the wavelength converting substrate 10Aa, exposing and etching the mask sheet such that a plurality of masks MK each having a rectangular shape in a plan view with a predetermined size are aligned in a matrix of rows and columns at regular intervals on the upper surface of the wavelength converting substrate 10Aa. The disposing masks S11 may be omitted. In other words, instead of performing the disposing masks S11, the wavelength converting substrate 10Aa is singulated into a plurality of members, a resist film is disposed on the upper surfaces of all the singulated members, then the target positions will be processed. In such a procedure, the disposing masks S11 may be omitted.

Singulating

Figure 5D:
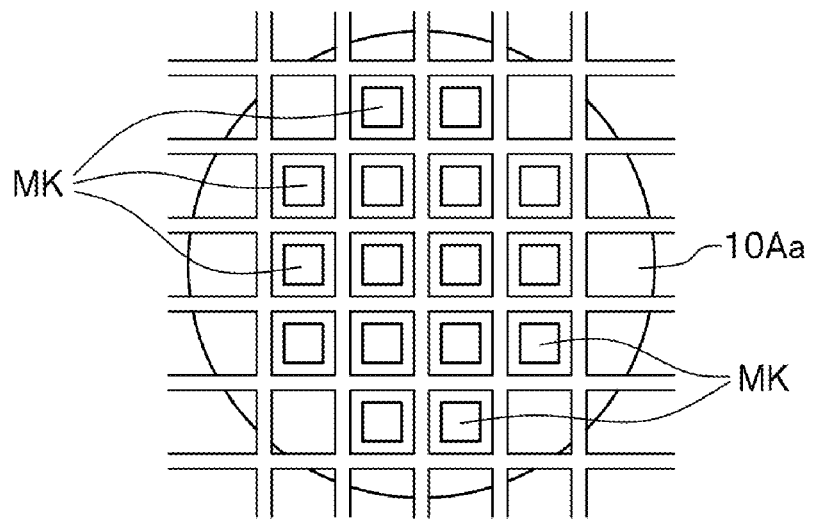
FIG. 5D is a schematic plan view illustrating singulating in the method of manufacturing a wavelength converting member according to one embodiment of the present disclosure.
Figure 5E:
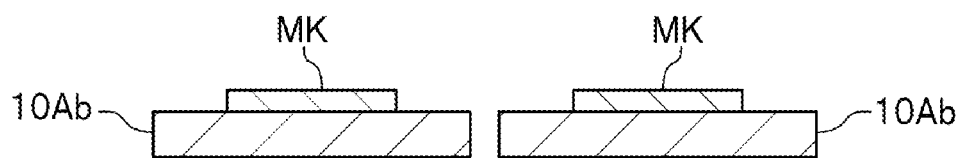
FIG. 5E is a schematic cross-sectional view illustrating a singulated state in the singulating according to one embodiment of the present disclosure.

Subsequently, as shown in FIG. 5A, FIG. 5D, and FIG. 5E, singulating S12 is carried out. In the singulating S12, the wavelength converting substrate 10Aa is singulated by e.g. cutting at predetermined first intervals such that each of the singulated members has upper surface dimensions greater than that of a single mask MK, into singulated members with a target size of the wavelength converting members 10A. In the singulating S12, it is preferable that an adhesive sheet (a first adhesive sheet) is attached on a lower surface of the wavelength converting substrate 10Aa and cutting is carried out with the adhesive sheet attached to the lower surface of the wavelength converting substrate 10Aa. The parts of the adhesive sheet attached on the singulated members 10Ab of the size of the wavelength converting members 10A are removed, and the singulated members 10Ab are aligned at another predetermined second intervals and affixed on another adhesive sheet (a second adhesive sheet). In the singulating S12, cutting can be carried out, for example, using a blade of a predetermined width. The cutting may be carried out by using laser light instead of using a blade.

Disposing Light-Shielding Film

Figure 5F:
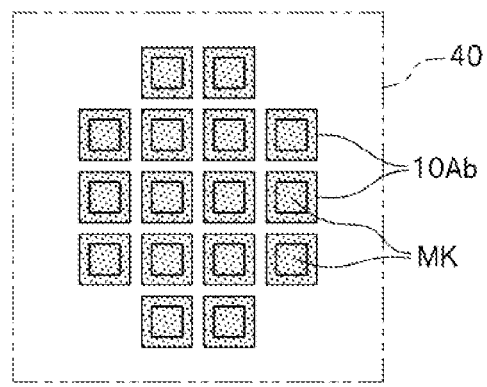
FIG. 5F is a schematic plan view illustrating disposing a light-shielding film in the method of manufacturing the wavelength converting member according to one embodiment of the present disclosure.
Figure 5G:
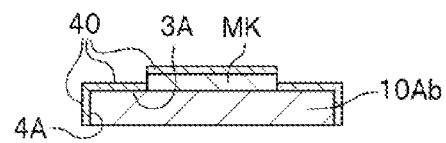
FIG. 5G is a schematic cross-sectional view illustrating a state in the disposing a light-shielding film, in which the light-shielding film have been disposed on the singulated member.

Subsequently, as shown in FIG. 5A, FIG. 5F, and FIG. 5G, disposing a light-shielding film S13 is carried out. When the light-shielding film is disposed in a state covering upper surfaces of all the masks MK and exposed portion of the upper surface of the wavelength converting substrate, the light-shielding film is referred to as "light-shielding film sheet 40." In the disposing a light-shielding film S13, a light-shielding film 40 is disposed on each of the upper surfaces and lateral surfaces of the singulated members 10Ab that are singulated from the wavelength converting substrate 10Aa and aligned at predetermined intervals, and on the upper surfaces of the masks MK disposed on the singulated members 10Ab. The light-shielding film sheet 40 can be formed by using a sputtering method, for example. For example, the light-shielding film 40A can be disposed by using a known technique such as vacuum evaporation, ion plating, ion vapor deposition (IVD), sputtering, ECR sputtering, plasma evaporation, chemical vapor phase growth (CVD), ECR-CVD, ECR-plasma CVD, electron beam deposition (EB), and atomic layer deposition (ALD). Of those, it is preferable to dispose the light-shielding film 40A by sputtering, which can be carried out in a relatively short period of time. The light-shielding film 40A can be affixed by using a known room-temperature bonding technique such as surface-activated bonding and atomic diffusion bonding. Further, when the light-shielding film 40A is adhered to the wavelength converting substrate or singulated members using an adhesive material, for example, an adhesive material of a type such as acrylic-based, urethane-based, styrene-based, epoxy-based, polyimide-based, silicone-based, BT resin-based, ester-based, ether-based, uria-based, polyamide-based, phenol-based or cellulose derivatives can be used. Those adhesives can also be used in a combination of two or more types as needed. The light-shielding film 40A is disposed to have a predetermined thickness. Because the singulated members are aligned with the predetermined intervals, the light-shielding film 40A is disposed continuously on the lateral surfaces of the singulated members 10Ab, as well as on the upper surfaces of the singulated members 10Ab. On the upper surface of each of the singulated members 10Ab, the light-shielding film 40A is formed in a square ring shape around the rectangular mask MK. In the disposing a light-shielding film S13, the operation is carried out while the singulated members 10Ab are aligned and affixed to the adhesive sheet.

Removing Masks

Figure 5H:
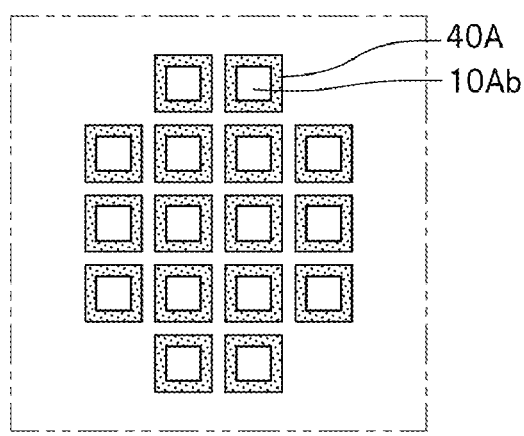
FIG. 5H is a schematic plan view illustrating a state in a removing the mask according to one embodiment of the present disclosure, in which the mask has been removed.
Figure 5I:
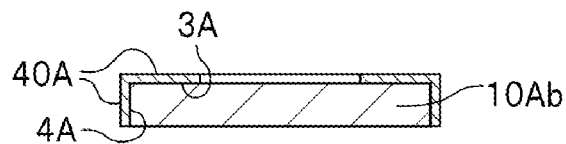
FIG. 5I is a schematic cross-sectional view illustrating a state in the removing the mask according to one embodiment of the present disclosure, in which the mask has been removed.

Subsequently, as shown in FIG. 5A, FIG. 5H, and FIG. 5I, removing masks S14 is performed. In the removing the masks S14, the masks MK disposed on the upper surfaces of the singulated members 10Ab are removed along with the light-shielding films 40 located on the masks MK. In the removing the masks S14, for example, the masks MK are removed by lift-off or laser lift-off along with the light-shielding films 40 on the masks MK. After removing the masks MK in the removing the masks S14, the portions of the upper surfaces of the singulated members 10Ab where the masks MK have been removed are exposed from the light-shielding films 40A and surrounded by the square-ring-shaped light-shielding films 40A. All the lateral surfaces of each of the singulated members 10Ab are covered by the light-shielding film 40A. In the removing the light-shielding film S14, the operation is carried out while the singulated members 10Ab are aligned and affixed to the adhesive sheet.

Processing

Figure 5J:
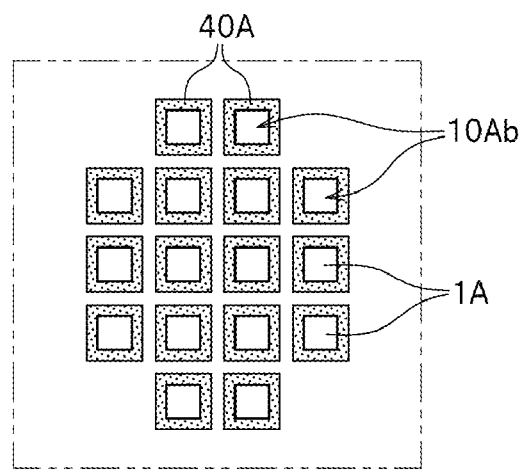
FIG. 5J is a schematic plan view illustrating processing according to one embodiment of the present disclosure.
Figure 5K:
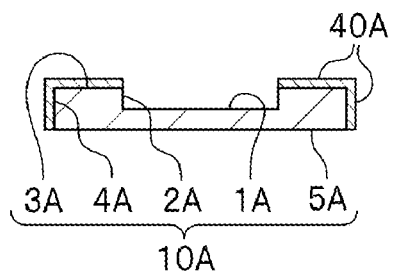
FIG. 5K is a schematic cross-sectional view illustrating a state in the processing according to one embodiment of the present disclosure, in which a discrete wavelength converting member has been obtained.

Next, as shown in FIG. 5A, FIG. 5J, and FIG. 5K, processing SI5 is performed. In the present embodiment, in the processing S15, the thickness of a portion of the upper surface of each of the singulated members 10Ab surrounded by the square-ring-shaped light-shielding film 40A is reduced, such that the portion exposed from the light-shielding film 40A has a thickness smaller than the portions covered by the light-shielding film 40A, and thus a recess as, for example, shown in FIG. 5K is formed. (With this processing process S15, the workpiece 10Ab is processed into a wavelength converter 10A with a recess as shown in FIG. 5K.) The processing S15 is carried out by, for example, laser etching. In laser etching, the shape and depth of the recess can be formed as needed by adjusting the irradiation duration, laser intensity, number of times of irradiation, wavelength, etc. The recesses can be formed by dicing, polishing, grinding, or the like. In the processing S15, the operation is carried out while the singulated members 10Ab are aligned and affixed to the adhesive sheet. According to the processing S15, the wavelength converting members 10A each having the first upper surface 1A, the first lateral surfaces 2A, the second lateral surfaces 4A, and the lower surface 5A, with the light-shielding film 40A disposed on the second upper surface 3A and the second lateral surfaces 4A can be obtained.

Method of Manufacturing Light Emitting Device

Figure 6A:
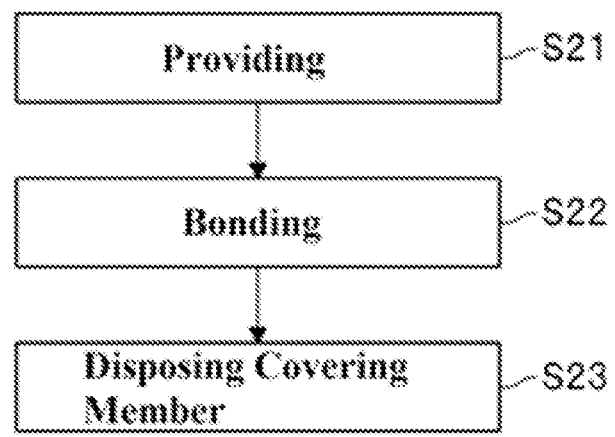
FIG. 6A is a flowchart illustrating a flow of operations of manufacturing the light emitting device according to the first embodiment.

As described above, by performing the disposing masks S11 to the processing S15, the wavelength converting members 10A respectively having the first upper surface 1A, the first lateral surfaces 2A, the second upper surface 3A and second lateral surfaces 4A covered by the light-shielding film 40A, and the lower surface 5A substantially in parallel to the first upper surface 1A are provided. In this case, the disposing masks S11 to the processing S15 correspond to providing S21 in the method of manufacturing light emitting device, as shown in FIG. 6A. In the method of manufacturing the light emitting device, the providing S21, bonding S22, mounting elements, and disposing covering member S23, are performed in that order.

Bonding

Figure 6B:
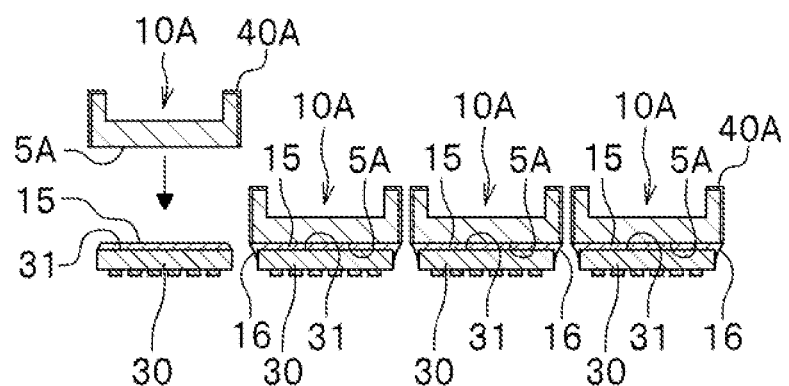
FIG. 6B is a schematic cross-sectional view illustrating bonding the wavelength converting members obtained according to the method of manufacturing a light emitting device according to the first embodiment to light emitting elements.

Subsequently, as shown in FIG. 6A and FIG. 6B, bonding S22 is carried out. In the bonding S22, the lower surface of the wavelength converting member 10A and the light extraction surface 31 of each of the at least one light emitting element 30 are arranged facing each other, and the wavelength converting member 10A is disposed on the light emitting element 30. In the bonding in the example shown in FIG. 6B, the light extraction surface of the at least one light emitting element 30 and the lower surface 5A of the wavelength converting member 10A are bonded via an adhesive material 15. In the bonding using an adhesive material 15 shown in FIG. 6B, the adhesive material 15 is dripped onto the light extraction surface 31, and the wavelength converting member 10A is disposed on the adhesive material 15. The adhesive material 15 applied by dripping is pressed down by the wavelength converting member 10A, and then wets up to the lateral surfaces of the light emitting element 30 to form a fillet 16 between the lower surface of the wavelength converting member 10A and the lateral surfaces of the light emitting element 30. The amount and viscosity of the adhesive material 15 to be dripped are appropriately adjusted so that the fillet 16 can be formed on the lateral surfaces of the light emitting element 30 while the adhesive material 15 is not wet spread on the substrate 50. In the bonding S22, the wavelength converting member 10A can be disposed on each of the at least one light emitting element 30 via an adhesive material 15 in a state in which the at least one light emitting element 30 is affixed to an adhesive sheet, or in which the at least one light emitting element 30 is mounted on the substrate 50.

Mounting Light Emitting Element

Figure 6C:
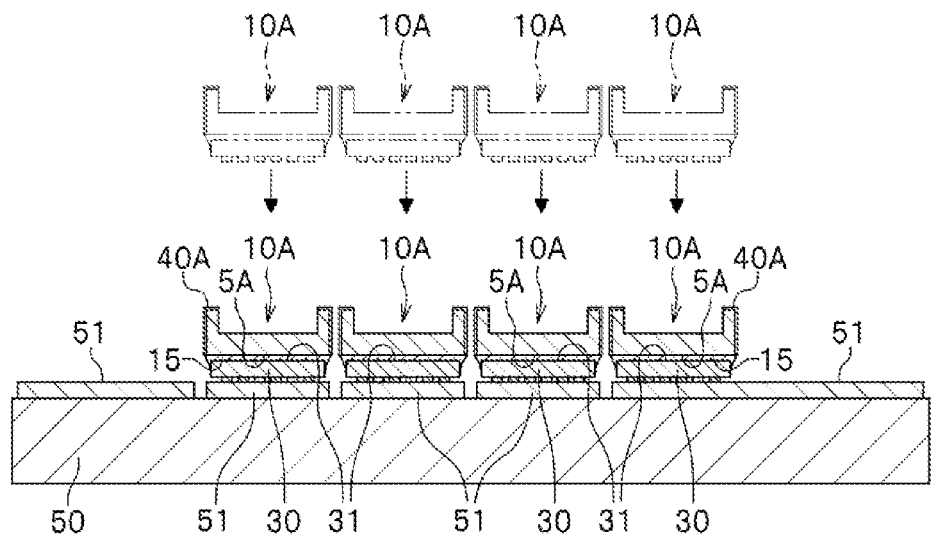
FIG. 6C is a schematic cross-sectional view illustrating bonding the light emitting elements having the wavelength converting members bonded thereto to a substrate in the method of manufacturing the light emitting device according to the first embodiment.

Next, mounting light emitting element is performed, for example, as shown in FIG. 6C, in which the at least one light emitting element 30 bonded with the wavelength converting member 10A is mounted on the electrically conductive wirings 51 of the substrate 50. In this case, the at least one light emitting element 30 is mounted on the electrically conductive wirings 51 of the substrate 50 via a bonding member such as bumps. The number of the light emitting elements mounted on substrate 50 depends on the purpose of use etc., and for example, when used as a chip-size package (CSP), a single light emitting element is mounted on the substrate 50. When the plurality of light emitting elements 30 are mounted on the substrate 50 (four light emitting elements in FIG. 6C), it is suitable for use, for example, in a vehicle's headlamps as a light emitting module.

Disposing Covering Member

Figure 6D:
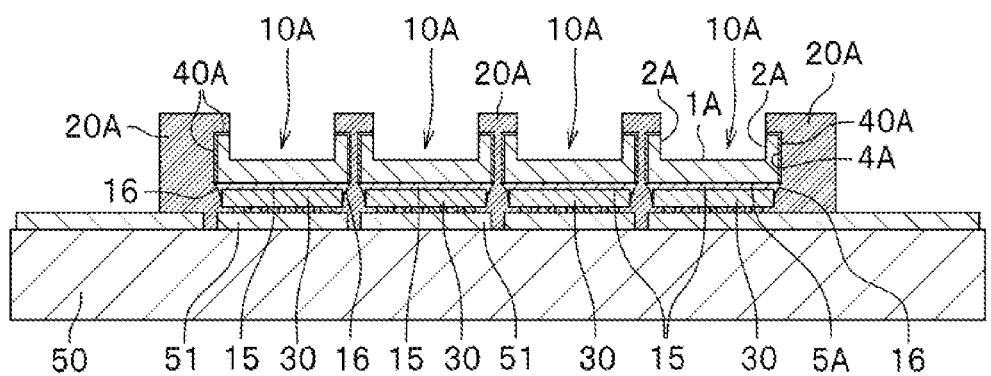
FIG. 6D is a schematic cross-sectional view illustrating disposing a covering member in the method of manufacturing the light emitting device according to the first embodiment.

Subsequently, as shown in FIG. 6A and FIG. 6D, disposing a covering member S23 is carried out. In the disposing a covering member S23, a covering member 20A configured to cover the at least one light emitting element 30, the wavelength converting member 10A, and the substrate 50 are disposed. In the disposing the covering member S23, the covering member 20A is applied up to a height that covers between the at least one light emitting element 30 and the substrate 50, and the at least one light emitting element 30 and the adhesive material 15 on the lateral surfaces of the at least one light emitting element 30. Further, the covering member 20A is applied to cover the second lateral surfaces 4A and the second surface 3A of the wavelength converting member 10A. In the disposing the covering member, it is also possible to dispose the covering member 20A with a single supply. The covering material 20A covers the second lateral surfaces 4A of the wavelength converting member 10A and the second upper surface 3A of the wavelength converting member via the light-shielding film 40A. In this case, it is preferable to adjust the viscosity and supply speed of the covering material 20A so that the covering member 20A does not flow over the second upper surface 3A onto the first lateral surfaces 2A or further onto the first upper surface 1A, and the first lateral surfaces 2A and the first upper surface 1A are exposed and are not covered by the covering member 20A. In the drawing, the corners of the covering member 20A are at angles, but it is possible to form the corners rounded.

When supplying the covering member 20A, it is preferable to drip on the upper surface of the substrate 50, at a location separated from the wavelength converting member 10A, through a nozzle etc. It is also possible to use two types of materials for the covering member 20A, of which, the material for the covering member 20A supplied earlier has a viscosity lower than that of the material for the covering member 20A supplied later. In the present embodiment, for example, a silicone resin containing titanium oxide is used for the material of the covering member 20A. When forming the covering member 20A, a form or a mold may also be used. In this case, the covering member 20A can be formed with angled corners. When forming the covering member 20A, the material may be supplied by potting, discharging, dripping, or spraying, etc. In this case, the covering member 20A can be formed with rounded corners. With the covering member 20A thus disposed, the light emitting device 100A shown in FIG. 1 can be obtained.

Variational Examples of First Embodiment

Figure 7A:
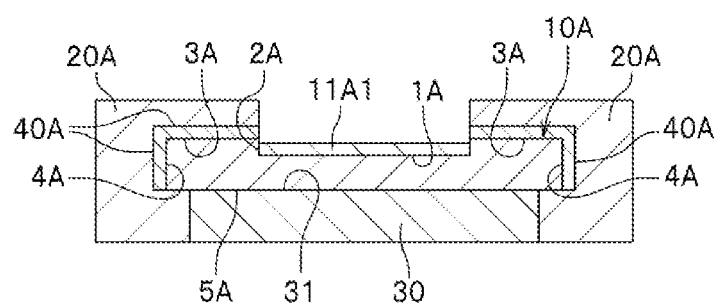
FIG. 7A is a schematic cross-sectional view showing a variational example 1 of the light emitting device shown in FIG. 1, where the substrate is not shown.

Next, variational examples of the wavelength converting member, covering member, the light emitting device etc., according to the first embodiment will be described below with reference to FIG. 7A to FIG. 9D. As a variational example 1, a configuration illustrated below may be employed. In the variational example 1, an anti-reflection film is disposed in the recess of the wavelength converting member 10A, whereas the anti-reflection film is not disposed in the recess of the wavelength converting member of the first embodiment. Other configurations are similar to those according to the first embodiment. In the variational example 1, as shown in FIG. 7A, a transparent anti-reflective coating (AR-coating) 11A1 may be disposed, for example, by using vacuum vapor deposition of silicon dioxide or magnesium fluoride on the first upper surface 1A and/or the first lateral surfaces 2A. The wavelength converting member 10A is provided with the AR-coating 11A1, which can improve the extraction efficiency. The AR-coating preferably has a thickness of ¼ of a wavelength of visible light. Also, the AR-coating 11A1 preferably has a refractive index that is closer to a refractive index of the wavelength converting member 10A and is smaller than the refractive index of the wavelength converting member 10A.

Figure 7B:
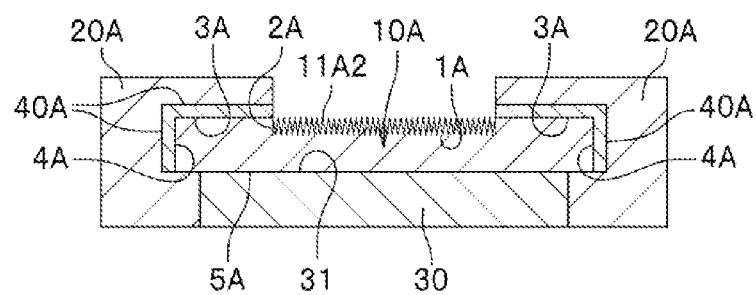
FIG. 7B is a schematic cross-sectional view showing a variational example 2 of the light emitting device shown in FIG. 1, where the substrate is not shown.

As a variational example 2, a configuration illustrated below may be employed. In the variational example 2, the first upper surface 1A has a roughened structure, whereas the first upper surface 1A of the wavelength converting member 10A according to the first embodiment has a flat structure. Other configurations are similar to those according to the first embodiment. In the variational example 2, as shown in FIG. 7B, the wavelength converting member 10A may have the first upper surface 1A having a roughened structure 11A2, formed using a device or a laser. The roughness of the roughened surface can be, for example, in a range of 0.5 to 5 μm. Forming the upper surface 1A of the wavelength converting member 10A with a rough structure 11A2 increases the light-emitting area of light emitted from the at least one light emitting element 30, such that the brightness can be improved.

Figure 7C:
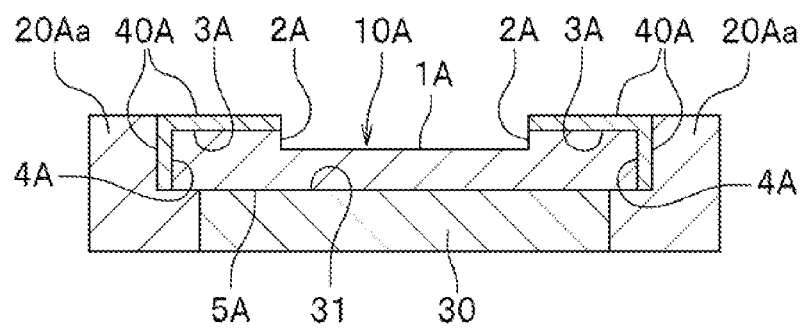
FIG. 7C is a schematic cross-sectional view showing a variational example 3 of the light emitting device shown in FIG. 1, where the substrate is not shown.

As a variational example 3, a configuration illustrated below may be employed. The second upper surface 3A and the second lateral surfaces 4A of the wavelength converting member 10A according to the first embodiment are covered by the covering member 20 via the light-shielding film 40A, that is, the light-shielding film 40A disposed on the second upper surface 3A is covered by the covering member 20A, whereas in the variational example 3, the light-shielding film 40A is not covered by the covering member 20A and is exposed. Other configurations are similar to those according to the first embodiment. In the variational example 3, as shown in FIG. 7C, a covering member 20Aa covering the wavelength converting member 10A may be disposed flush with the light-shielding film 40A disposed on the second upper surface 3A of the wavelength converting member 10A. That is, the wavelength converting member 10A is configured so that the second upper surface 3A is not covered by the covering member 20Aa. The light-shielding film 40A is disposed on the second upper surface 3A and the second lateral surfaces 4A of the wavelength converting member 10A.

Figure 7D:
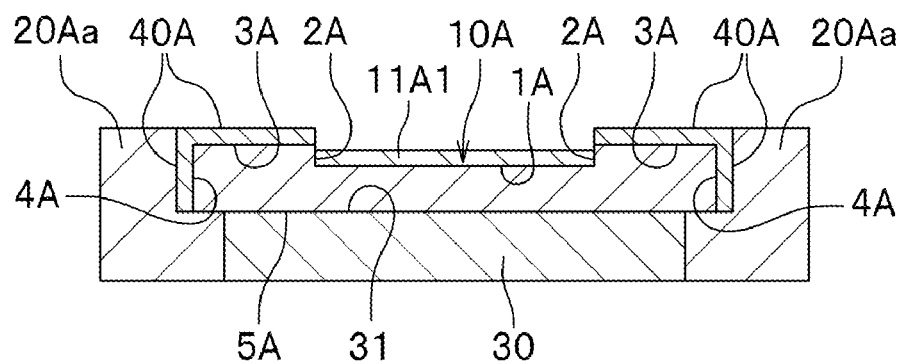
FIG. 7D is a schematic cross-sectional view showing a variational example 4 of the light emitting device shown in FIG. 1, where the substrate is not shown.
Figure 7E:
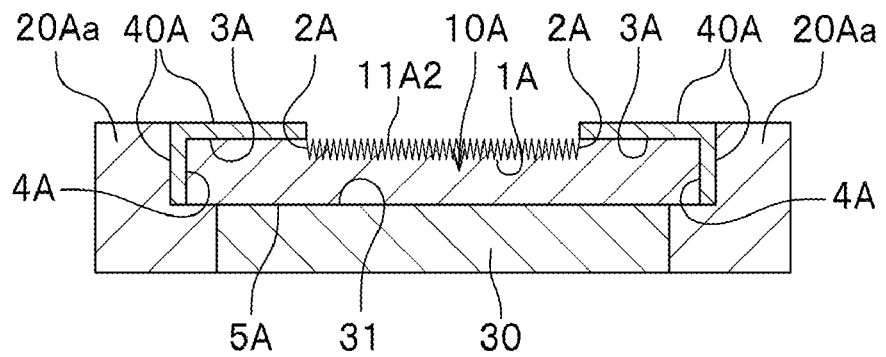
FIG. 7E is a schematic cross-sectional view showing a variational example 5 of the light emitting device shown in FIG. 1, where the substrate is not shown.

As a variational example 4, a configuration illustrated below may be employed. The wavelength converting member 10A of the variational example 3 has the first upper surface 1A that remains in situ, whereas in the variational example 4 as shown in FIG. 7D, a transparent anti-reflection film is disposed on the first upper surface 1A of the recess. Other configurations are similar to those according to the variational example 3. Alternatively, as a variational example 5, a configuration illustrated below may be employed. In the variational example 3, the wavelength converting member 10A of the first upper surface 1A has a flat structure, whereas the first upper surface 1A of the variational example 5 has a roughened structure. Other configurations are similar to those according to the variational example 3. As shown in FIG. 7D and FIG. 7E, in the configuration in which that second surface 3A of the wavelength converting member 10A is not covered by the covering member 20Aa, an AR-coating 11A1 may be provided on the first upper surface 1A as in the variational example 4, or the first upper surface 1A may be formed with a roughened structure 11A1 as in the variational example 5.

Figure 8A:
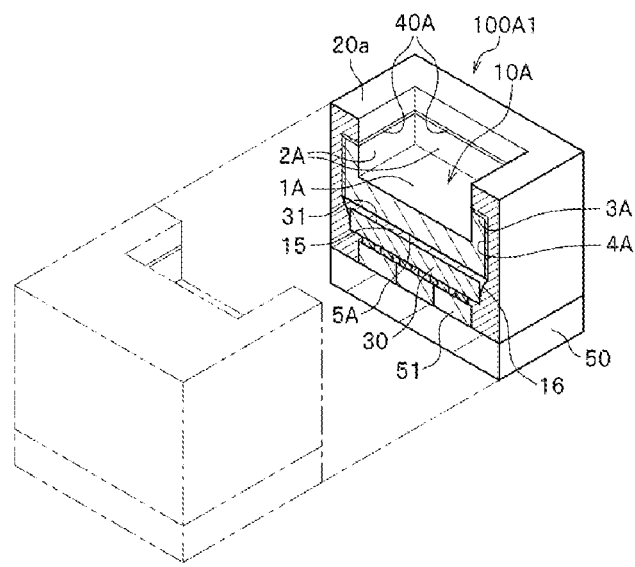
FIG. 8A is a schematic sectional perspective view showing a variational example 6 of the light emitting device according to the first embodiment.

As a variational example 6, a configuration illustrated below may be employed. In the light emitting device 100A of the first embodiment, a plurality of light emitting elements are disposed, whereas in the variational example 6, a single light emitting element is disposed. Other configurations are similar to those according to the first embodiment. As shown in FIG. 8A, the light emitting device 100A1 is configured to have a single light emitting element 30 and a single wavelength converting member 10A, in which a covering member 20a may be disposed corresponding to the single wavelength converting member 10A and the light emitting element 30.

Figure 8B:
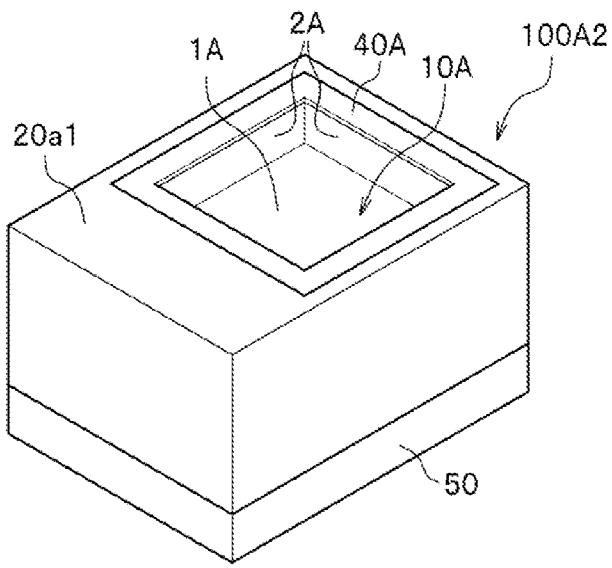
FIG. 8B is a schematic perspective view showing a variational example 7 of the light emitting device according the first embodiment.

As a variational example 7, a configuration illustrated below may be employed. In the wavelength converting member 10A of the variational example 6, the second upper surface 3A and the second lateral surfaces 4A connected to the outer edges of the second upper surface 3A are covered by the covering member 20 via the light-shielding film 40A, and the light-shielding film 40A disposed on the second upper surface 3A is covered by the covering member 20A, whereas in the variational example 7, the light-shielding film 40A located on the second upper surface 3A is not covered by the covering member 20A, and the light-shielding film 40A located on the second upper surface 3A is exposed. Other configurations are similar to those according to the variational example 6. As shown in FIG. 8B, in the light emitting device 100A2, the covering member 20a1 is disposed flush with the light-shielding film 40A located on the second upper surface 3A and not to cover the second upper surface 3A. The configuration of the variational example 6 and the variational example 7 allow light emitting devices 100A1 and 100A2 to be formed with the dimensions close to the dimensions of the light emitting element 30, while also allowing light to be extracted in a state that can provide good visibility.

Figure 8C:
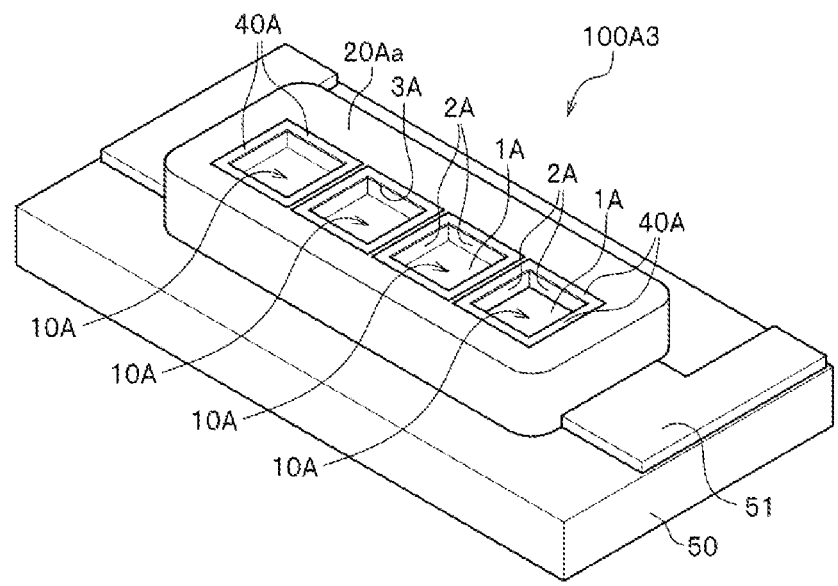
FIG. 8C is a schematic perspective view showing a variational example 8 of the light emitting device according the first embodiment.

As a variational example 8, a configuration illustrated below may be employed. In the light emitting device 100A of the first embodiment, the second upper surface 3A and the second lateral surfaces 4A of the wavelength converting member 10A are covered by the covering member 20 via the light-shielding film 40A, that is, the light-shielding film 40A disposed on the second upper surface 3A is covered by the covering member 20A, whereas in the variational example 8, the light-shielding film 40A located on the second upper surface 3A is not covered by the covering member 20A and is exposed. Other configurations are similar to those according to the first embodiment. As shown in FIG. 8C, the covering member 20Aa covering the wavelength converting member 10A may be disposed flush with the light-shielding film 40A located on the second upper surface 3A of the wavelength converting member 10A. That is, the wavelength converting member 10A is configured so that the light-shielding film 40A is disposed on the second upper surface 3A and the second upper surface 3A is not covered by the covering member 20Aa.

Figure 9A:
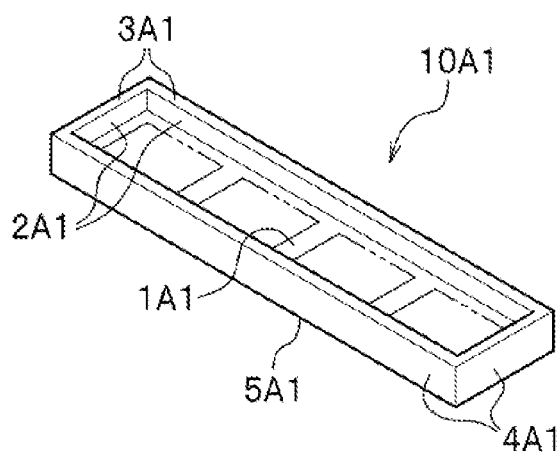
FIG. 9A is a schematic perspective view showing a variational example of a wavelength converting member according to the first embodiment, as a variational example 9.
Figure 9B:
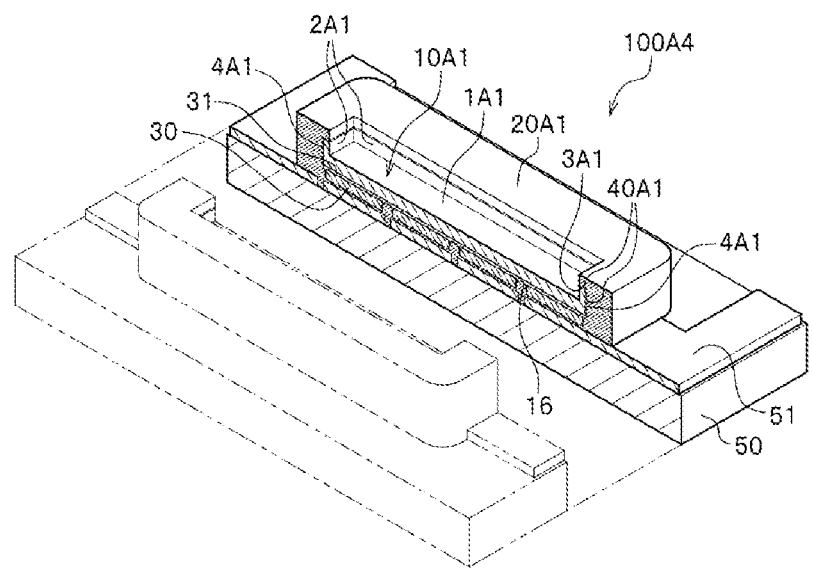
FIG. 9B is a schematic perspective diagram of a cross section of a part of a light emitting device that uses the wavelength converting member shown in FIG. 9A.

As a variational example 9, a configuration illustrated below may be employed. In the light emitting device 100A of the first embodiment, each of the wavelength converting members 10A is disposed for each of the light emitting elements 30, whereas in the variational example 9, a single wavelength converting member 10A1 is disposed for a plurality of the light emitting elements 30. Other configurations are similar to those according to the first embodiment. In other words, FIG. 9A shows a perspective view of the wavelength converting member 10A of the variational example 9. As the light emitting device 100A4 shown in FIG. 9B, a single wavelength converting member 10A1 having dimensions corresponding to all the plurality of light emitting elements (group of light emitting elements) 30 may be employed.

Figure 9C:
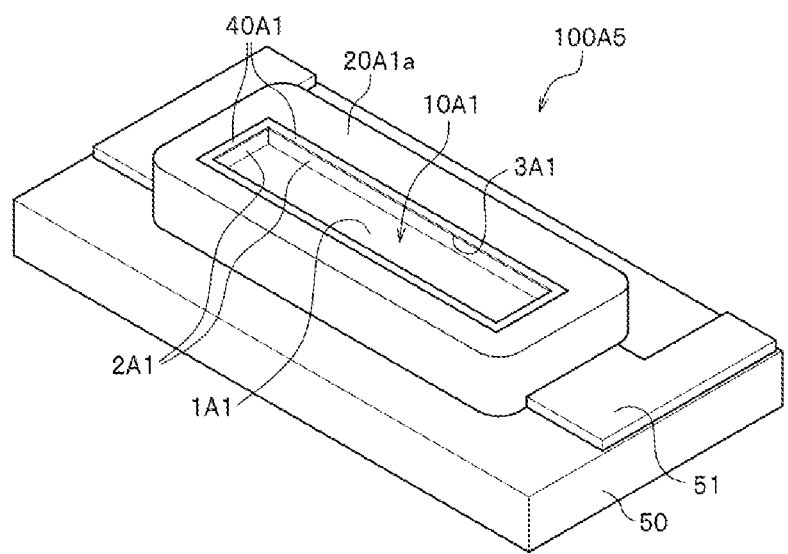
FIG. 9C is a schematic perspective view showing a variational example 10 of the light emitting device using the wavelength converting member shown in FIG. 9A.

As a variational example 10, a configuration illustrated below may be employed. In the wavelength converting member 10A1 of the variational example 9, the covering member 20A1 is disposed on the second upper surface 3A1 via the light-shielding film 40A1 such that the light-shielding film 40A1 disposed on the second upper surface 3A1 is covered by the covering member 20A1, whereas in the variational example 10, the covering member 20A1 is not disposed on the light-shielding film 40A1 located on the second upper surface 3A1, such that the light-shielding film 40A1 located on the second upper surface 3A1 is exposed. Other configurations are similar to those according to the variational example 9. In other words, as shown in FIG. 9C, the covering material 20A1a of the light emitting device 100A5 is designed so that it does not cover the light-shielding film 40A1, which is formed on the second upper surface 3A1 of the wavelength converting member 10A1. The area dimension of the lower surface 5A1 of the wavelength converting member 10A1 is formed to be larger than a total area dimensions of all the light extraction surfaces 31 of the light emitting elements 30 that are disposed.

Figure 9D:
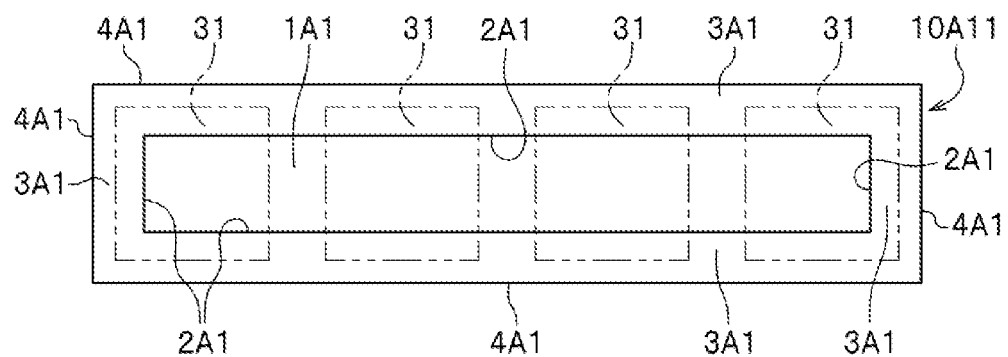
FIG. 9D is a schematic plan view showing a variational example 11, the wavelength converting member shown in FIG. 9A as a variational example 11.
Figure 10:
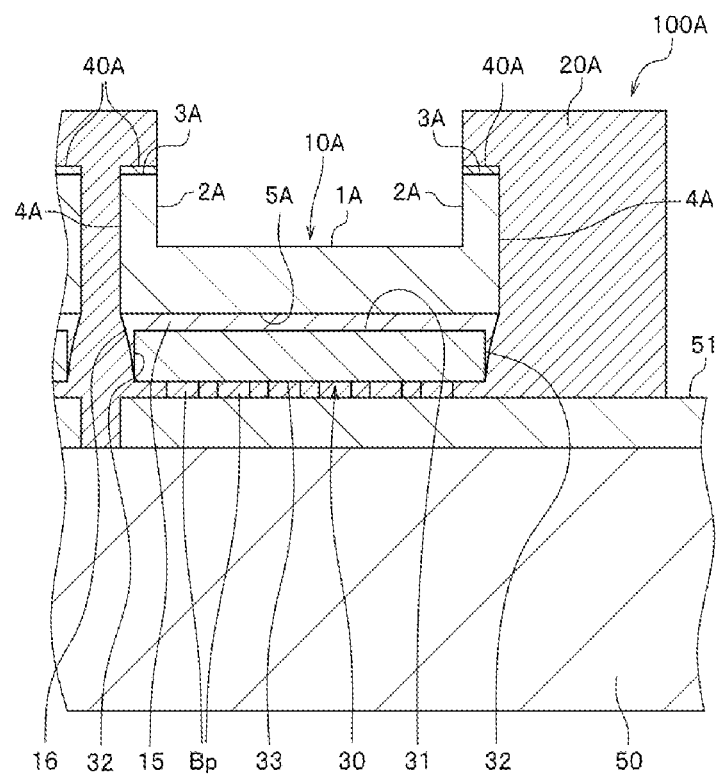
FIG. 10 is a schematic cross-sectional view showing a cross-section of a part of a light emitting device according to a second embodiment as a variational example 12.

As a variational example 11, a configuration illustrated below may be employed. In the variational example 10, the area dimension of the lower surface 5A1 of the wavelength converting member 10 is greater than the sum of the light-extraction surfaces 31 of the light emitting elements 30, whereas in the variational example 11, the area dimension of the lower surface 5A1 of the wavelength converting member 10 is greater than the sum of the light-extraction surfaces 31 of the light emitting elements 30, and also the area dimension of the first upper surface 1A1 of the wavelength converting member 10A11 is less than the sum of the light-extraction surfaces 31 of the light emitting elements 30. Other configurations are similar to those according to the variational example 9. As shown in FIG. 9D, the wavelength converting member 10A11 may be formed such that the first upper surface 1A1 is equal to that of the lower surface 5A1, and less than the sum of the surface dimensions of all the light-extraction surfaces 31 of the light emitting elements 30 that are disposed. The single bodies of the wavelength converting member 10A1 and 10A11 can receive light from the plurality of light emitting elements 30, and allows extraction of light from the first upper surface 1A1 and the first lateral surface 2A1, with the light-shielding film 40A1 disposed on the second upper surface 3A1 and the second lateral surfaces 4A1 respectively. Accordingly, the light emitting devices 100A4 and 100A5 can provide light of good visibility for wider light illumination range.

Light Emitting Device and Wavelength Converting Member According to Second Embodiment Next, with reference to FIG. 10 to FIG. 12A, a second embodiment having a modified configuration of the light-shielding film 40A will be described as a variational example 12. In the light emitting devices 100A, 100A1 to 100A5 discussed above, the light-shielding films 40A, 40A1 are respectively disposed on the second upper surfaces 3A, and 3A1, and the second lateral surfaces 4A and 4A1, whereas in the variational example 12 shown in FIG. 10 and FIG. 12A, the light-shielding film 40A is disposed to cover the second upper surface 3A and is not formed on the second lateral surfaces 4A. In other respects, the configuration is similar to that of the light emitting devices 100A, 100A1-100A5, which was discussed above. With the light-shielding film 40A disposed on the second upper surface 3A of the wavelength-converting member 10A, light of good visibility can be emitted from the first upper surface 1A and the first lateral surfaces 2A.

Figure 11:
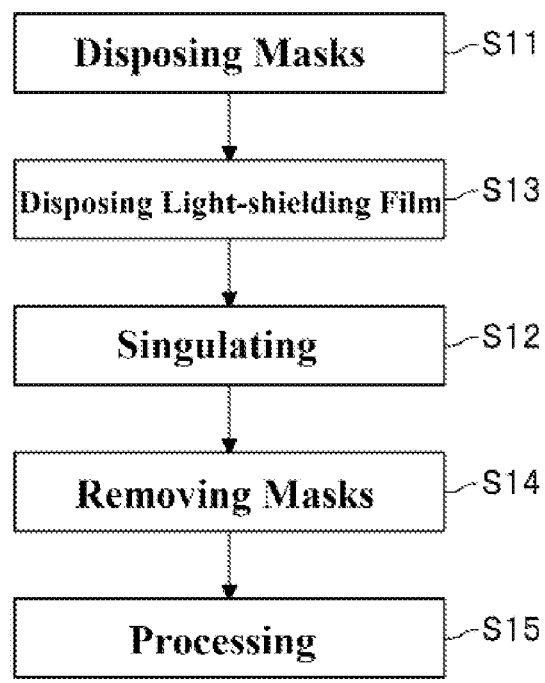
FIG. 11 is a flowchart illustrating a method of manufacturing a wavelength converting member for use in the light emitting device according to the second embodiment.

Next, a method of manufacturing a wavelength converting member configured to be disposed on the second surface 3A without having the light-shielding film 40A on the second lateral surfaces 3A of the wavelength converting member 10A. As illustrated in FIG. 11, the disposing a mask: S11, the disposing a light-shielding film: S13, the singulating: S12, and the removing the mask: S15 are carried out in this order. Each step S11 to S15 can be performed as described above. By carrying out the disposing a light-shielding film: S13 prior to the singulating: S12, the light-shielding film 40A can be disposed on the second upper surface 3A of the wavelength converting member 10A without disposing the light-shielding film 40A on the second lateral surfaces 4A. The wavelength converting member 10A as described above, having the light-shielding film 40A on the second upper surface 3A and not on the second lateral surfaces 4A, can be used in combination with a basic configuration such as that shown in FIG. 12A, as variational examples as shown in FIG. 12B to FIG. 12F, in a similar manner as those described above.

Variational Examples of Second Embodiment

Figure 12A:
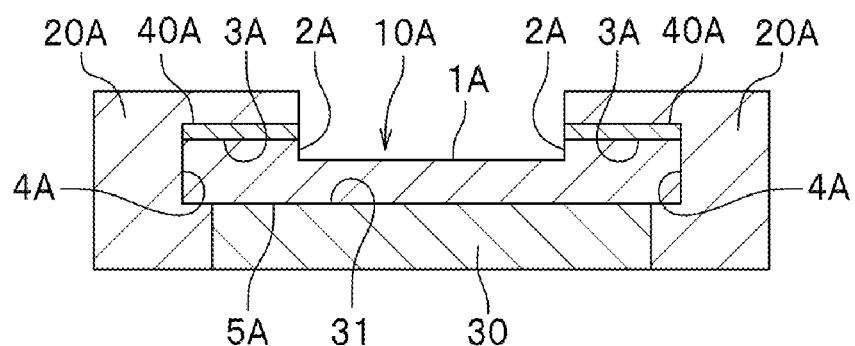
FIG. 12A is a schematic cross-sectional view showing a structure of the light emitting device according to the second embodiment, in which the substrate is not shown.
Figure 12B:
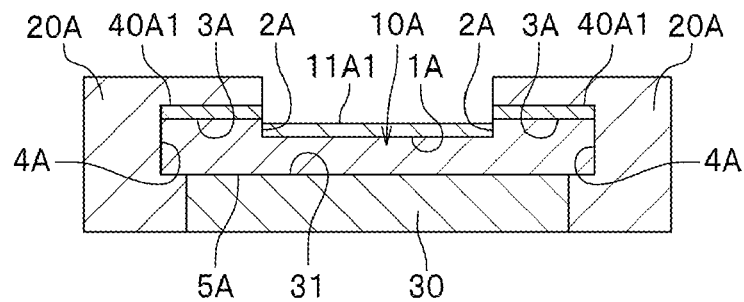
FIG. 12B is a schematic cross-sectional view showing a variational example of the light emitting device shown in FIG. 12A, as a variational example 13.
Figure 12C:
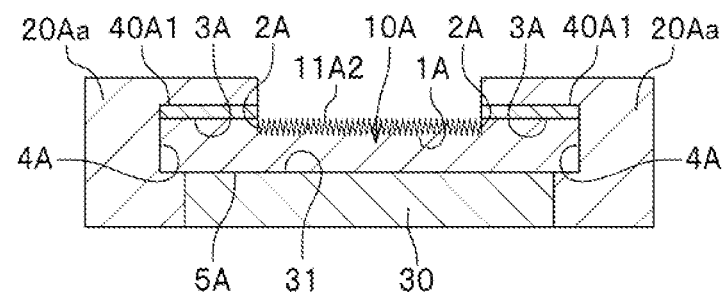
FIG. 12C is a schematic cross-sectional view of a variational example of the light emitting device shown in FIG. 12A as a variational example 14.
Figure 12D:
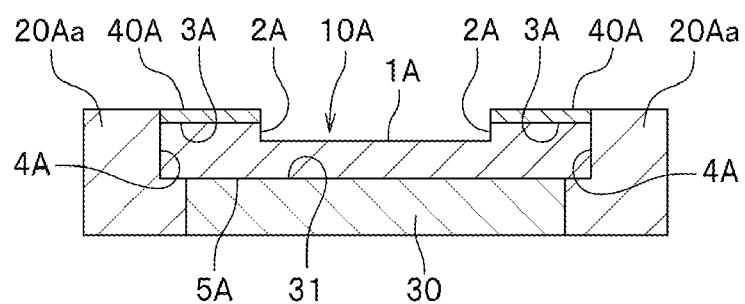
FIG. 12D is a schematic cross-sectional view showing a variational example of the light emitting device shown in FIG. 12A as a variational example 15.
Figure 12E:
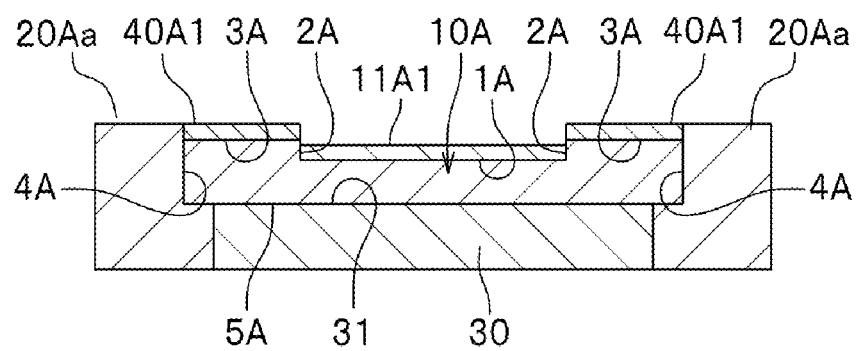
FIG. 12E is a schematic cross-sectional view of a variational example of the light emitting device shown in FIG. 12A, as a variational example 16.
Figure 12F:
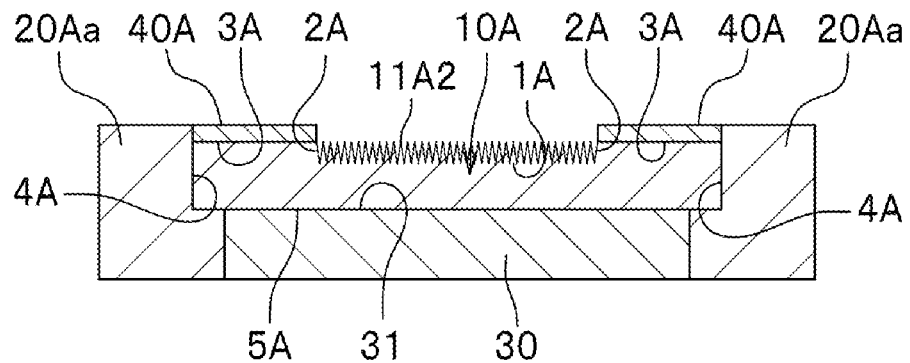
FIG. 12F is a schematic cross-sectional view showing a variational example of the light emitting device shown in FIG. 12A, as a variational example 17.

The light emitting devices 100A1 to 100A5 in which the light-shielding films 40A and 40A1 are disposed on the second upper surfaces 3A and 3A1, and not disposed on the second lateral surfaces 4A and 4A1, may have configurations described below. In FIG. 12B to FIG. 12F, the adhesive material 15 and the substrate 50 are not shown. The same or similar reference numerals may be applied to the components that have been described above and description thereof may be appropriately omitted. For example, as shown in FIG. 12B, an AR Coat 11A1 may be disposed on the first upper surface 1A of the wavelength converting member 10A, as a variational example 13. In addition, as shown in FIG. 12C, a roughened surface 11A2 may be formed on the first upper surface 1A of the wavelength converting member 10A as a variational example 14. Also as shown in FIG. 12D, as a variational example 15, the covering member 20Aa may be disposed to a height exposing the light-shielding film 40A located on the second upper surface 3A. Moreover, as shown in FIG. 12E, as a variational example 16, the covering member 20Aa may be formed at a height exposing the light-shielding film 40A located on the second upper surface 3A, and also the AR coat 11A1 may be disposed on the first upper surface 1A of the wavelength converting member 10A. Further, as shown in FIG. 12F, the covering member 20Aa may be disposed to a height to expose the light-shielding film 40A located on the second upper surface 3A, and also a roughened surface 11A2 may be formed on the first upper surface 1A of the wavelength converting member 10A, as a variational example 17.

Figure 13A:
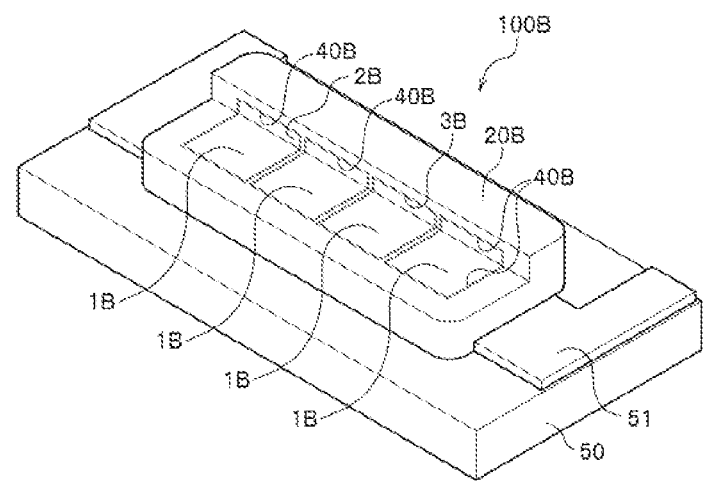
FIG. 13A is a schematic perspective view showing a variational example 18 of a light emitting device according to a third embodiment.
Figure 13B:
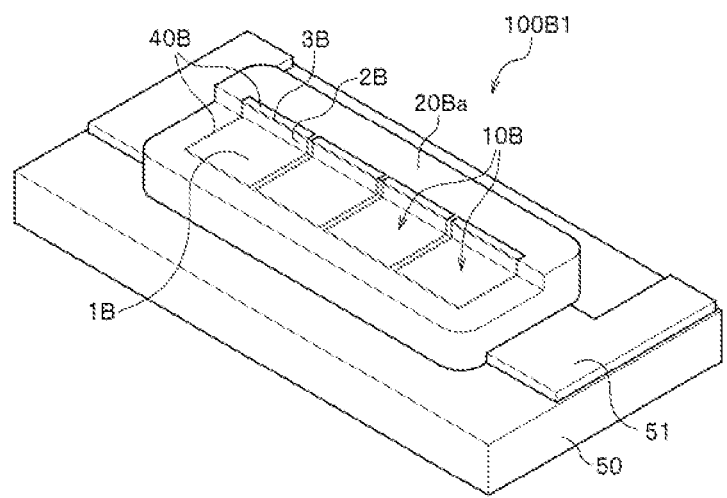
FIG. 13B is a schematic perspective view of a variation of the light emitting device according to the third embodiment, as a variational example 19.
Figure 13C:
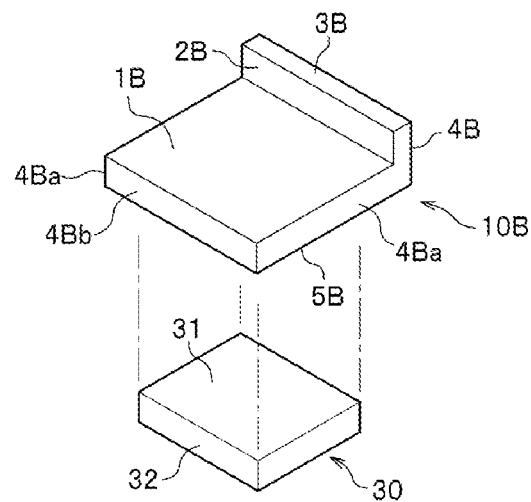
FIG. 13C is a schematic perspective view illustrating a structure of a wavelength converting member and a light emitting element for use in the light emitting device according to the third embodiment.
Figure 14A:
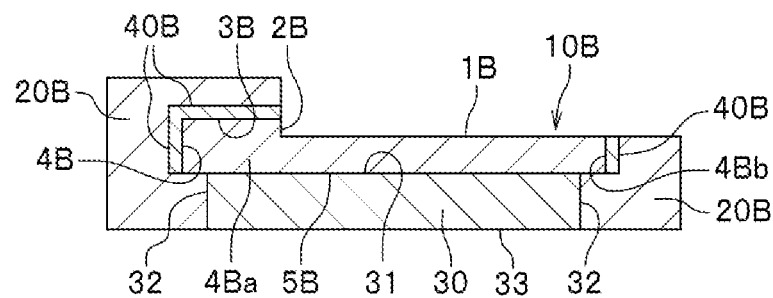
FIG. 14A is a schematic cross-sectional view of a variational example 18 of the light emitting device shown in FIG. 13A and FIG. 13B in which the substrate is not shown.

Light Emitting Device and Wavelength Converting Member According to Third Embodiment Next with reference to FIG. 13A, FIG. 13C, and FIG. 14A, a light emitting device according to a third embodiment will be described, as a variational example 18. In the cross-sectional view shown in FIG. 14A, the substrate 50 and the adhesive material 15 are not shown. The same or similar reference numerals may be applied to the components that have been described above and description thereof may be appropriately omitted. The light emitting device 100B includes a plurality of light emitting elements 30, a plurality of wavelength converting members 10B, a covering member 20B, and a plurality of light-shielding films 40B. In the light emitting device 100B, the plurality of wavelength converting members 10B have a structure different from that illustrated above. In other respects, the configuration is substantially similar to that of the light emitting devices 100A, 100A1-100A5, described above.

Each of the wavelength converting members 10B according to the third embodiment differs from the wavelength converting member 10A according to the first embodiment or the second embodiment in that the second upper surface 3B is formed only on one side of the rectangular first upper surface 1B, and the second upper surface is not formed on the other side. That is, each of the wavelength converting members 10B has a first lateral surface 2B that is substantially orthogonal and continuous to only one of the sides of the first upper surface 1B that is formed in a rectangular shape, that is, the first lateral surface 2B and the second upper surface 3B are not formed at the three other sides. Each of the wavelength converting members 10B has three other lateral surfaces 4Ba, 4Ba, and 4Bb, each being substantially orthogonal and continuous to the first upper surface 1B and the lower surface 5B of each of the wavelength converting members 10B. The lateral surfaces 4Ba and 4Ba are located on the opposite sides from each other in a position adjacent to the first lateral surface 2B. The lower edges of the lateral sides 4Ba and 4Ba are formed continuous to to the bottom side 5B. The lateral surface 4Bb is located at a side opposite from the first lateral surface 2B with the lower edge being orthogonal to the lower surface 5B and orthogonally continuous to the lower surface 5B.

The wavelength converting member 10B is formed in an L-shape in a cross-section in a first direction orthogonal to the lateral surface first lateral surface 2B and to the lower surface 5B, and in a rectangular shape corresponding to a thickness between the first upper surface 1B and the lower surface 5B in a cross-section in a second direction that is orthogonal to the first direction. The lower surface 5B of the wavelength converting members 10B has an area dimension greater than an area dimension of the light extraction surface of a corresponding one of the light emitting elements 30. Further, as shown in FIG. 13A and FIG. 14A, in the variational example 18, the covering member 20B is formed with a height substantially the same height substantially equivalent to the first upper surface 1B and also orthogonal to the first lateral surface 2B, and further to cover the second upper surface 3B via the light-shielding film 40B.

In each of the wavelength converting members 10B of the light emitting device 100B, the second upper surface 3B is covered by the covering member 20B via the light-shielding film 40B, and the first lateral surface 2B and the first upper surface 1B are not covered by the covering member 20B and are exposed. In the light emitting device 100B, light emitted from the light extraction surface 31 of each of the light emitting elements 30 is received by the lower surface 5B of the wavelength converting member 10B and is extracted to the outside from the first upper surface 1B and the first lateral surface 2B. Accordingly, the light emitting device 100B can increase the intensity of the light on one side of the radiation area corresponding to the side on which the first lateral surface 2B are located. The light emitting devices 100B, 100B1 and the wavelength converting member 10B, which are part of the third embodiment, can be manufactured through the same steps described in the manufacturing the wavelength converting member 10A in the first embodiment, except that the target portions in the processing S15 are different. In other words, when manufacturing the wavelength converting member 10B, the steps illustrated in FIG. 5B to FIG. 5I can be used. Then, in the processing shown in FIG. 5J and FIG. 5K, three sides of the light-shielding film 40B disposed in a square-ring shape are removed and the remaining single side is processed to the second upper surface 3B. It can also be manufactured in the similar way even if some of the steps are interchanged as shown in FIG. 11. Similarly, the light emitting device 100B can be manufactured by the method described above.

Variational Examples of Third Embodiment

As variational examples 19 to 30, configurations of the light emitting devices according to the third embodiment will be described below with reference to FIG. 13B, FIG. 13D, and FIG. 14B to FIG. 15D. In the cross-sectional views shown in FIG. 14B to FIG. 16D, the substrate 50 and the adhesive material 15 are not shown. Also, the same reference numerals will be applied to the configurations described above, and description thereof will be appropriately omitted. The variational example 19 differs from the variational example 18 in that the covering member 20Ba is disposed to a height equivalent to the light-shielding film 40B disposed on the second upper surface 3B of the wavelength converting member 10B, as shown in FIG. 13B and FIG. 14B. Other configurations are similar to those according to the third embodiment.

Figure 13D:
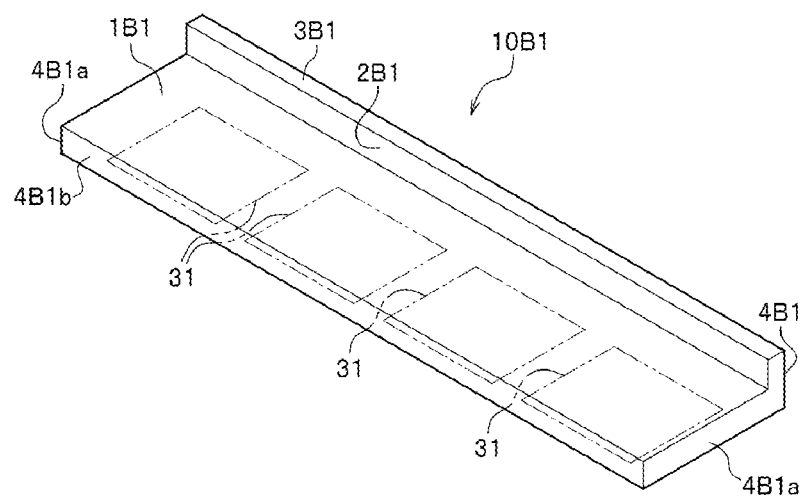
FIG. 13D is a schematic perspective view showing a variational example of the wavelength converting member used in the light emitting device shown in FIG. 13A and FIG. 13B as a variational example 20.
Figure 14B:
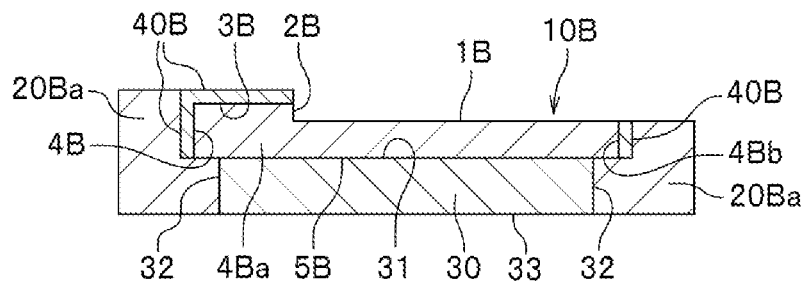
FIG. 14B is a schematic cross-sectional view of a variational example 19 of the light emitting device shown in FIG. 13A and FIG. 13B, in which the substrate is not shown.

Further, in the variational example 18 and the variational example 19, a single wavelength converting member 10B is disposed corresponding to a single light emitting element 30, but as shown in FIG. 13D as the variational example 20, a configuration of a single wavelength converting member 10B1 disposed corresponding to a plurality of light emitting elements 30 (four as an example in FIG. 13D) may also be employed. When the wavelength covering member 10B1 is used, the covering member having a configuration either of the covering member 20B or of the covering member 20Ba may be employed. In other words, in all the configurations shown in FIG. 14A to FIG. 16D, the wavelength converting member 10B may be the wavelength converting member 10B1. Other configurations are similar to those according to the third embodiment.

Figure 14C:
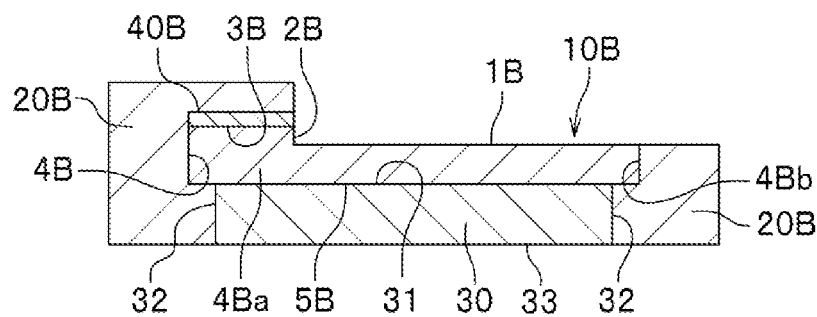
FIG. 14C is a schematic cross-sectional view of a variational example 21 of the light emitting device shown in FIG. 13A and FIG. 13B, in which the substrate is not shown.
Figure 14D:
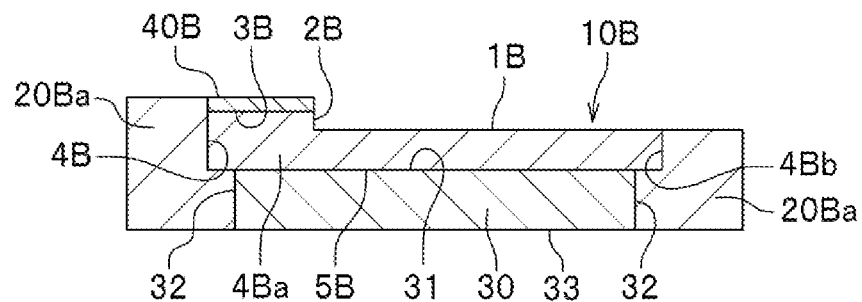
FIG. 14D is a schematic cross-sectional view of a variational example 22 of the light emitting device shown in FIG. 13A and FIG. 13B, in which the substrate is not shown.

As shown in FIG. 14C and FIG. 14D, the wavelength converting members 10B and 10B1 may have different configurations than those in the variational examples 18 and 19, in that as the variational examples 21 and 22, the light-shielding film 40B is disposed on the second upper surface 3B and not on the second lateral surfaces 4B and the lateral surfaces 4Ba and 4Bb.
Other configurations are similar to those according to the third embodiment.

Figure 15A:
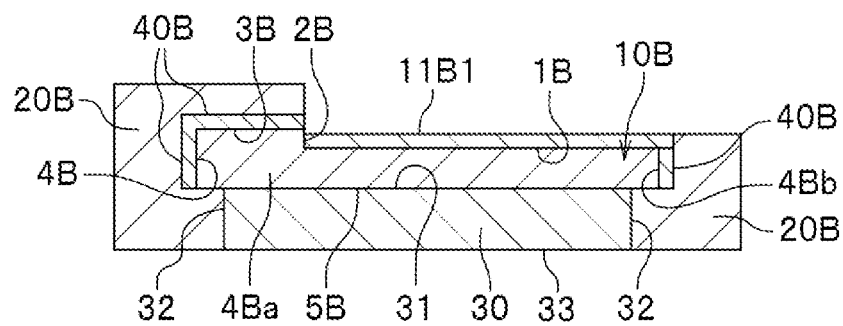
FIG. 15A is a schematic cross-sectional view of a variational example 23 of the light emitting device shown in FIG. 13A and FIG. 13B, in which the substrate is not shown.
Figure 15B:
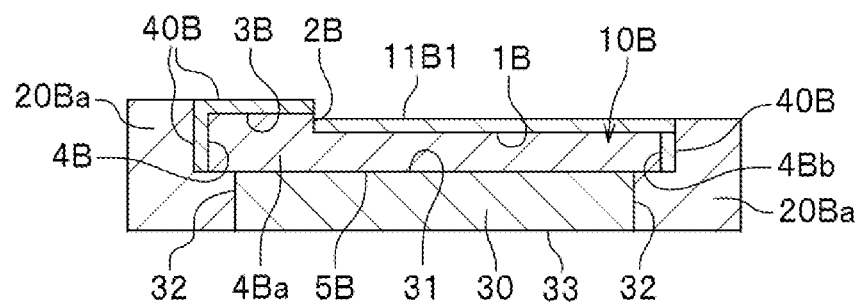
FIG. 15B is a schematic cross-sectional view of a variational example 24 of the light emitting device shown in FIG. 13A and FIG. 13B, in which the substrate is not shown.
Figure 15C:
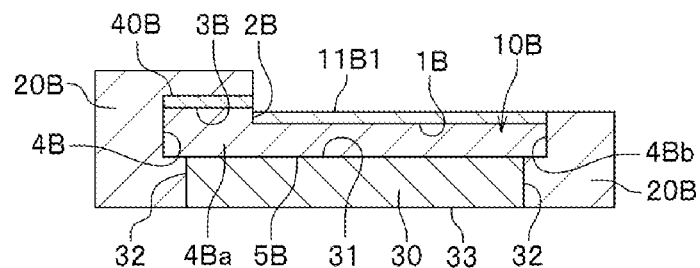
FIG. 15C is a schematic cross-sectional view of a variational example 25 of the light emitting device shown in FIG. 13A and FIG. 13B, in which the substrate is not shown.
Figure 15D:
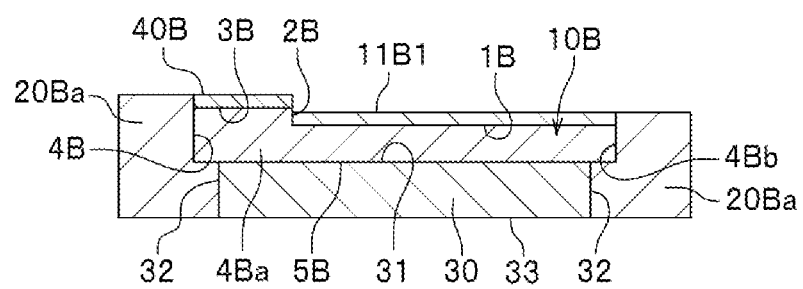
FIG. 15D is a schematic cross-sectional view of a variational example 26 of the light emitting device shown in FIG. 13A and FIG. 13B, in which the substrate is not shown.

Further, the configurations shown below as the variational examples 23 to 26 may also be employed. In the variational examples 23 to 26, a transparent anti-reflection film is disposed in the recess of the wavelength converting member 10B, whereas the transparent anti-reflection film is not disposed in the recess of the wavelength converting member 10B according to the third embodiment. Other configurations are similar to those according to the third embodiment. As shown in FIG. 15A to FIG. 15D, an AR coat 11B1 may be disposed on the first upper surface 1B of the wavelength converting member 10B. As shown in FIG. 15A and FIG. 15B, the wavelength converting member 10B may have configurations of variational examples 23 and 24, in that the light-shielding film 40B is disposed on the second lateral surfaces 4B and the lateral surfaces 4Ba and 4Bb, or configurations of variational examples 25 and 26, in that the light-shielding film 40B is not disposed on the second lateral surfaces 4B and the lateral surfaces 4Ba and 4Bb.

Figure 16A:
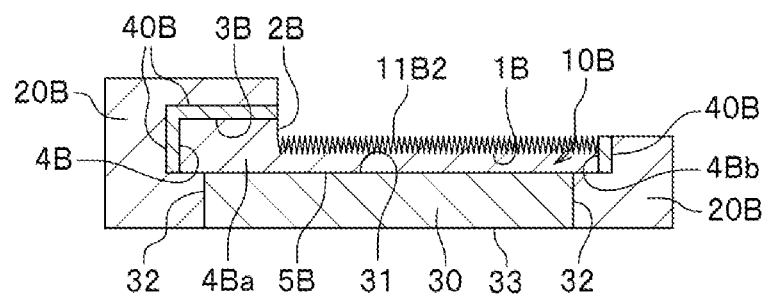
FIG. 16A is a schematic cross-sectional view of a variational example 27 of the light emitting device shown in FIG. 13A and FIG. 13B, in which the substrate is not shown.
Figure 16B:
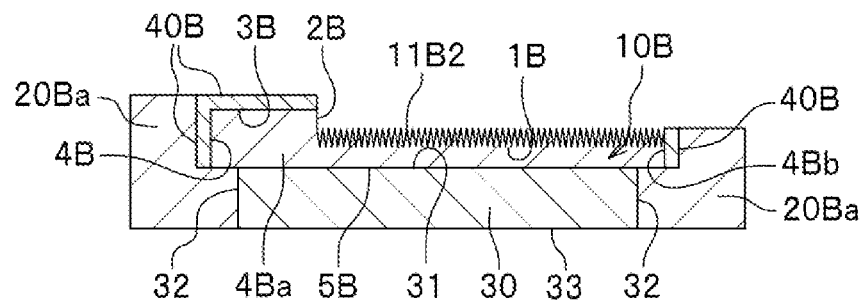
FIG. 16B is a schematic cross-sectional view of a variational example 28 of the light emitting device shown in FIG. 13A and FIG. 13B, in which the substrate is not shown.
Figure 16C:
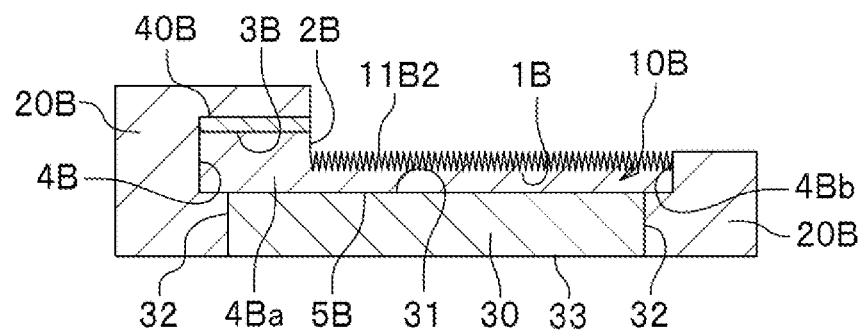
FIG. 16C is a schematic cross-sectional view of a variational example 29 of the light emitting device shown in FIG. 13A and FIG. 13B, in which the substrate is not shown.
Figure 16D:
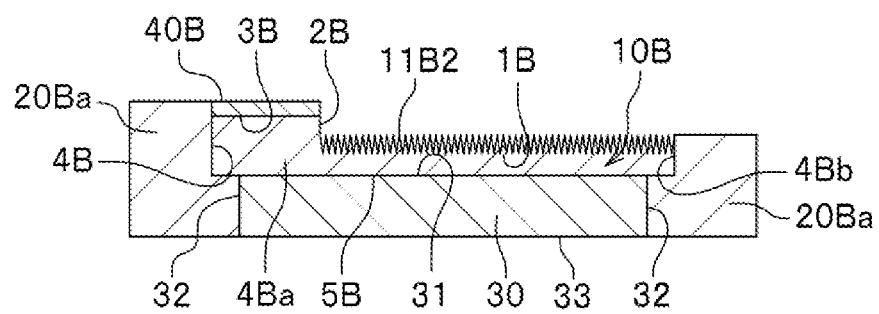
FIG. 16D is a schematic cross-sectional view of a variational example 30 of the light emitting device shown in FIG. 13A and FIG. 13B, in which the substrate is not shown.

Further, the configurations shown below as the variational examples 27 to 30 may also be employed. In the variational examples 27 to 30, the first upper surface 1B of the wavelength converting member 10B has a roughened structure 11B2, whereas the first upper surface 1B of the wavelength converting member 10B according to the third embodiment remains in situ. Other configurations are similar to those according to the third embodiment. As shown in FIG. 16A to FIG. 16D, the first upper surface 1B of the wavelength converting member 10A may have a roughened surface 11B2 as variational examples 27 to 30. As shown in FIG. 16A and FIG. 16B as the variational examples 27 and 28, the wavelength converting member 10B may have a configuration in that the light-shielding film 40B is disposed on the second lateral surface 4B and the lateral surfaces 4Ba and 4Bb, or as shown in FIG. 16C and FIG. 16D as the variational examples 29 and 30, the wavelength converting member 10B may have a configuration in that the light-shielding film 40B is not disposed on the second upper surface 4B and the second lateral surfaces 4Ba and 4Bb.

Figure 17A:
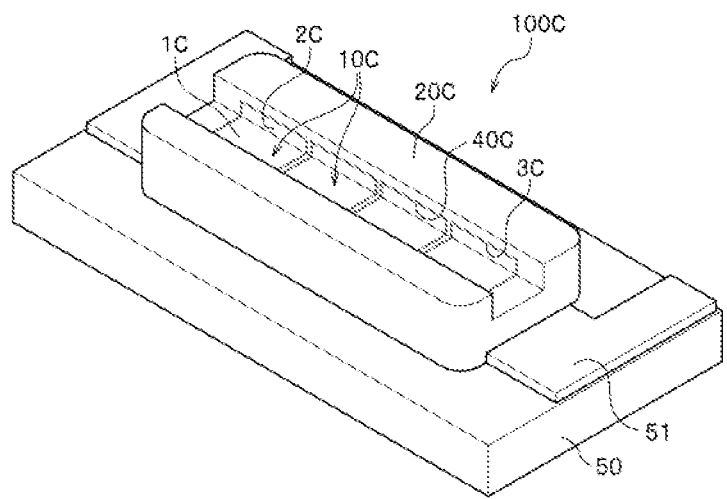
FIG. 17A is a schematic perspective view showing a light emitting device according to a fourth embodiment, as a variational example 31.
Figure 17B:
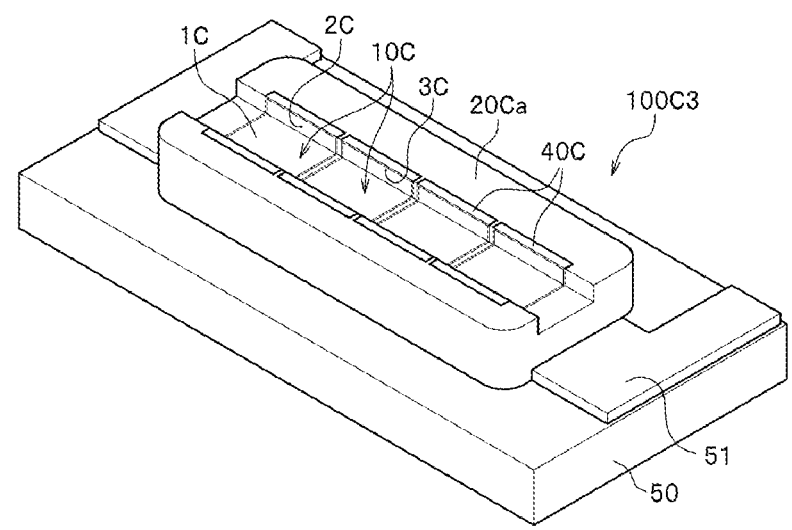
FIG. 17B is a schematic perspective view showing a light emitting device according to the fourth embodiment, as a variational example 32.
Figure 17C:
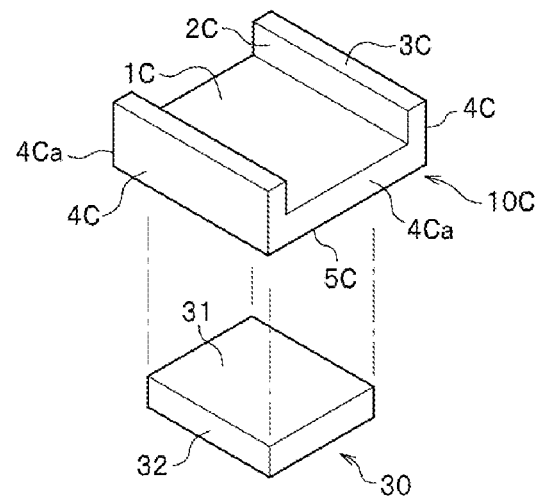
FIG. 17C is a schematic perspective view showing a wavelength converting member used in the light emitting device and a light emitting device according to the fourth embodiment.

Light Emitting Device and Wavelength Converting Member According to Fourth Embodiment Next, a light emitting device 100C according to a fourth embodiment will be described as variational examples 31 to 33, with reference to FIG. 17A to FIG. 17D. The light emitting device 100C has a wavelength converting member 10C having a configuration different from that of the light emitting device 100A according to the first embodiment. That is, of a first two opposite sides and a second two opposite sides of the first upper surface 1C having a rectangular shape, the wavelength converting members 10C has a first lateral surface 2C and a second upper surface 3C along each side of the first two opposite sides of the first upper surface 1C, but not along each side of the second two opposite sides of the first upper surface 1C. Now, mainly the configuration of the wavelength converting member 10C will be described below. In the light emitting device 100C, as a variational example 31 as shown in FIG. 17A and FIG. 17C, each of the wavelength converting members 10C includes a first upper surface 1C in a rectangular shape with a first two opposite sides and a second two opposite sides that are substantially orthogonal to the first two opposite sides, two first lateral surfaces 2C respectively extending substantially orthogonally upward from along the first two opposite sides of the first upper surface 1C, two second upper surfaces 3C respectively substantially orthogonally continuous with the first lateral surfaces 2C and substantially in parallel to the first upper surface 1C, and two second lateral surfaces 4C respectively substantially orthogonally continuous with the second upper surfaces 3C and extend downward, two lateral surfaces 4Ca respectively substantially orthogonally continuous with the second two opposite sides of the first upper surface 1C, and a lower surface 5C substantially orthogonally continuous with the second lateral surfaces 4C and the lateral surfaces 4Ca and substantially in parallel to the first upper surface 1C.

In other words, the second upper surface 3C is formed along each side of the first two opposite sides of the first upper surface 1C having a rectangular shape in a plan view. Each of the wavelength converting member 10C includes the first lateral surface 2C, the second upper surface 3C, and the second lateral surface at each of the first two opposite sides of the first upper surface 1C, and the lateral surface 4Ca at each of the second two opposite sides that are substantially orthogonal to the first two opposite sides. Each of the lateral sides 4Ca is a U-shape in a lateral view. Also, each of the wavelength converting members 10C has an area dimension not greater than an area dimension of the light extraction surface 31 of a corresponding one of the light emitting elements 30. The lower surface 5C of the wavelength converting members 10C has an area dimension greater than a area dimension of the light extraction surface 31 of a corresponding one of the light emitting elements 30. As shown in FIG. 17C, a cross-sectional shape of each of the wavelength converting members 10C in a direction orthogonal to the first two opposite sides of the first upper surface 1C is similar to that of the wavelength converting member 10A of the first embodiment. Also, in a direction orthogonal to the second two opposite sides of the first upper surface 1C, a cross-section of each of the wavelength converting members 10C in a direction orthogonal to the second two opposite sides of the first upper surface 1C has a rectangular shape.

Further, the covering member 20C is disposed to a height equivalent to the first upper surface 1C at the second two opposite sides of the rectangular first upper surface 1C. The covering member 20C is disposed flush with the first lateral surfaces 2C along the first two opposite sides of the rectangular first upper surface 1C. Further, the covering member 20C is disposed to cover the second upper surfaces 3C via the light-shielding film 40C. Each of the wavelength converting member 10C has a size that corresponds to a single light emitting element 30. In the light emitting device 100C, which uses the wavelength converting members 10C formed as described above, light emitted from the area having the first lateral surfaces 2C can be enhanced.

Figure 17D:
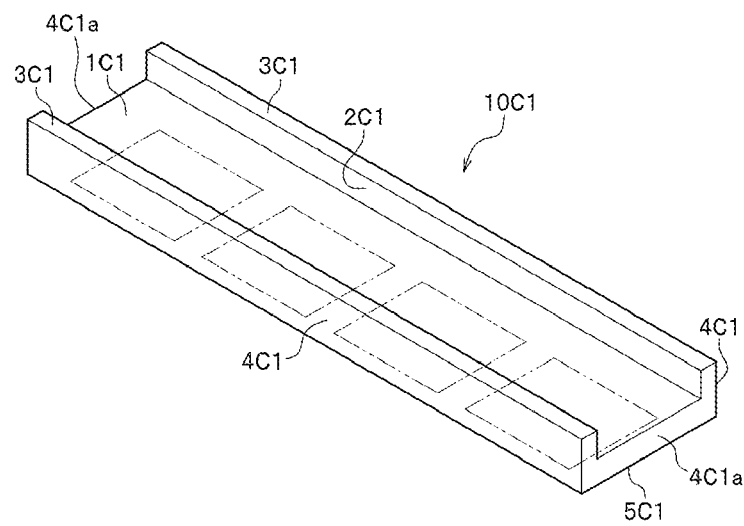
FIG. 17D is a schematic perspective view of a variational example of the wavelength converting member for use in the light emitting device shown in FIG. 17A and FIG. 17B, as a variational example 33.

In a method of manufacturing the wavelength converting member 10C, the steps illustrated in FIG. 5B to FIG. 5I can be used. Then, in the processing, illustrated in FIG. 5J and FIG. 5K, removing two sides of the light-shielding film 40A that has a quadrangular ring shape and processing the remaining two sides to the second upper surfaces 3C. The wavelength converting member 10C can also be manufactured in the similar way even if some of the steps are interchanged as illustrated in FIG. 11. Also as shown in FIG. 17B as a variational example 32, in the light emitting device 100C3, the covering member 20Ca may be disposed to a height equivalent to the light-shielding film 40C so that the covering member 20Ca does not cover the light-shielding film 40C located on the second upper surfaces 3C. Other configurations are similar to those according to the fourth embodiment. The light emitting devices 100C and 100C3 may employ a wavelength converting member 10C1 of a variational example 33 as shown in FIG. 17D, in which a single wavelength converting member 10C1 is installed corresponding to a plurality of light emitting elements 30 (four light emitting elements in the figure). Further, the wavelength converting members 10C and 10C1 can also be formed as in the variational examples illustrated in FIG. 7A to FIG. 7E, and FIG. 12B to FIG. 12F. In other words, an AR coat may be disposed on the first upper surface 1C, or the first upper surface is formed with a roughened structure. In addition, the light emitting devices 100C and 100C3 can employ a single light emitting element 30 as in the light emitting devices 100A1 and 100A2.

Figure 18A:
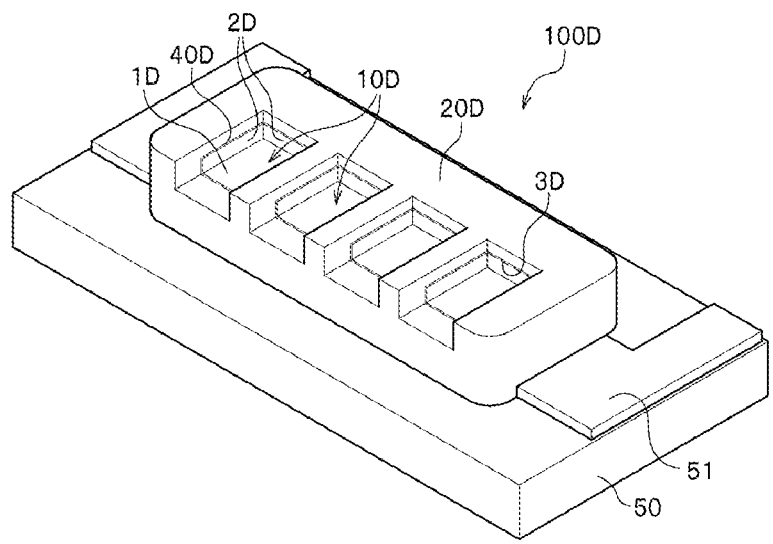
FIG. 18A is a schematic perspective view showing a light emitting device according to a fifth embodiment, as a variational example 34.
Figure 18B:
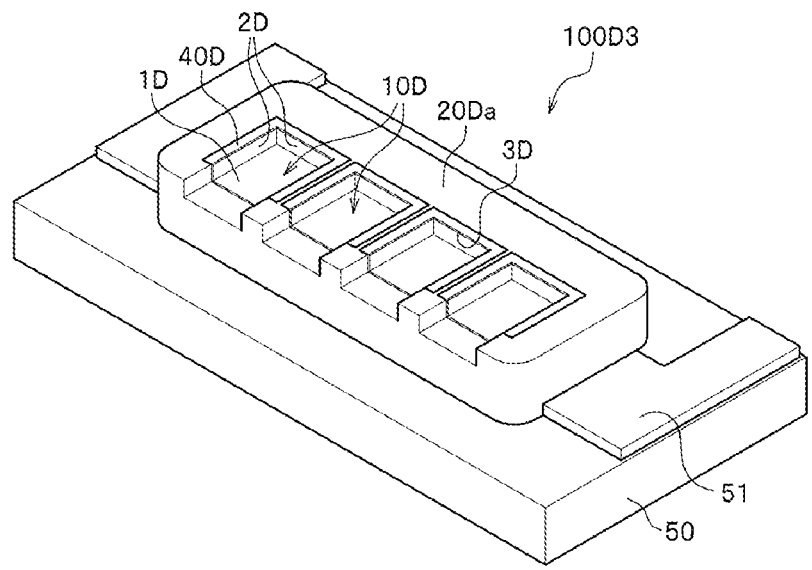
FIG. 18B is a schematic perspective view showing a variational example of the light emitting device according to the fifth embodiment, as a variational example 35.
Figure 18C:
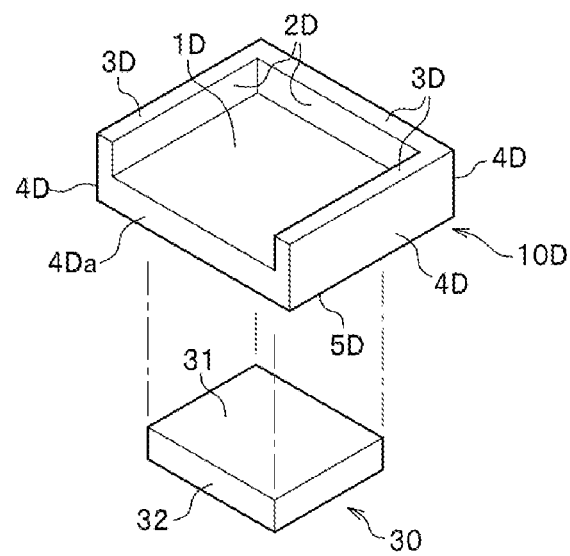
FIG. 18C is a schematic perspective view showing a wavelength converting member for use in the light emitting device and a light emitting device according to the fifth embodiment.

Light Emitting Device and Wavelength Converting Member According to Fifth Embodiment Next, a light emitting device 100D according to a fifth embodiment will be described as variational examples 34 to 36, with reference to FIG. 18A to FIG. 18D. The light emitting device 100D has wavelength converting members 10D having a configuration different from that of the light emitting device 100A according to the first embodiment. That is, each of the wavelength converting members 10D includes a first lateral surface 2D and a second upper surface 3D along each of three sides of the first upper surface 1D, but not along one side of the first upper surface 1C. Now, mainly the configuration of the wavelength converting member 10D will be described below. In the light emitting device 100D, as a variational example 34 as shown in FIG. 18A and FIG. 18C, each of the wavelength converting members 10D includes a first upper surface 1D in a rectangular shape, three first lateral surfaces 2D respectively extending substantially orthogonally upward from along three sides of the first upper surface 1D, three second upper surfaces 3D respectively substantially orthogonally continuous with the first lateral surfaces 2D, three second lateral surfaces 4D respectively substantially orthogonally continuous with the second upper surfaces 3D and extend downward, a lateral surface 4Da substantially orthogonally continuous with the remaining fourth side of the first upper surface 1D, and a lower surface 5D substantially orthogonally continuous with the second lateral surfaces 4D and the lateral surface 4Da.

In other words, the second upper surfaces 3D are formed along the three sides of the rectangular first upper surface 1D in a plan view. Of the four sides of the wavelength converting member 10D in a plan view, the first lateral surface 2D, the second upper surface 3D, and the second lateral surface 4D are formed along three sides, and the lateral surface 4Da is formed along the remaining fourth side. The lateral side 4Da is a U-shape in a lateral view. Also, the lower surface 5D of each of the wavelength converting members 10D has an area dimension equal to or greater than an area dimension of the light extraction surface 31 of a corresponding one of the light emitting elements 30.

Further, the first upper surface 1D of each of the wavelength converting members 10D has an area dimension equal to or less than an area dimension of the light-extraction surface 31 of a corresponding one of the light of all emitting elements 30. As shown in FIG. 18C, each of the wavelength converting members 10D has a cross-sectional shape, in the direction substantially parallel to the lateral surface 4Da, of a U-shape similar to that of the wavelength converting member 10A according to the first embodiment, shown in, for example, FIG. 4. Also, the wavelength converting member 10D has a cross-sectional shape of an L-shape, similar to that of the wavelength converting member 10B according to the third embodiment, shown in, for example, FIG. 14A, in the direction orthogonal to the first two opposite sides of the first upper surface 1D. Further, portions of the covering member 20D are coplanar with each of the first upper surfaces 1D at one side of the rectangular shape of each of the first upper surfaces 1D. At the three sides of the rectangular shape of each of the first upper surfaces 1D, portions of the covering member 20D are coplanar with the first lateral surfaces 2D. Further, the covering member 20D is disposed to cover the second upper surfaces 3D via the light-shielding film 40. Each of the wavelength converting members 10D has a size corresponding to a size of a single light emitting element 30. In the light emitting device 100D using the wavelength converting members 10D formed as described above, light emitted from the area having the first lateral surfaces 2D can be enhanced.

In a method of manufacturing the wavelength converting member 10D, the steps illustrated in FIG. 5B to FIG. 5I can be used. Then, in the processing illustrated in FIG. 5J and FIG. 5K, removing one side of the light-shielding film 40A that has a quadrangular ring shape, and processing to form the second surfaces 3C along the remaining three sides. Alternatively, the wavelength converting members 10C can also be manufactured in the similar way even if some of the steps are interchanged as illustrated in FIG. 11. Also as shown in FIG. 18B as a variational example 35, in the light emitting device 100D3, the covering member 20Da may be disposed flush with the light-shielding film 40D so that the covering member 20Da does not cover the light-shielding film 40D located on the second upper surfaces 3D.

Figure 18D:
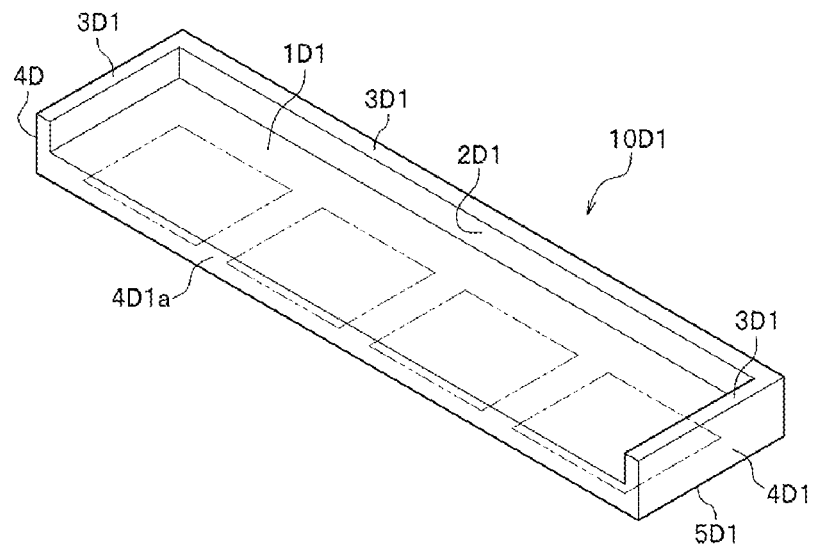
FIG. 18D is a schematic perspective view showing a variational example of a wavelength converting member for use in the light emitting device shown in FIG. 18A and FIG. 18B, as a variational example 36.

The light emitting devices 100D and 100D3 of a variational example 36, as shown in FIG. 18D, may have configurations in which a single wavelength converting member 10D1 is disposed corresponding to a single light emitting element 30 (four light emitting elements in the figure). Other configurations are similar to those according to the fifth embodiment. Further, the wavelength converting members 10D and 10D1 can also be formed as variational examples as shown in FIG. 7A to FIG. 7E, and FIG. 12B to FIG. 12F. In other words, an AR coat may be disposed on the first upper surfaces 1D, or the first upper surface is formed with a roughened structure. In addition, the light emitting devices 100D and 100D3 can employ a single light emitting element 30 as in the light emitting devices 100A1 and 100A2.

In the light emitting devices described above, the number of one or four light emitting elements is illustrated with reference to the drawing, but the number of the light emitting elements may be two, three, or five or more. Further, the wavelength converting member was specifically described as a structure with a size corresponding to one light emitting element or four light emitting elements, but a configuration in which two wavelength converting members with a size corresponding to two or three light emitting elements may be employed in a single light emitting device.

Further, the wavelength converting members in all the configurations described above may each have the lower surface with an area dimension greater than a sum of the light-extraction surfaces of the light emitting elements and also the first upper surfaces with an area dimension less than a sum of the light-extraction surfaces of the light emitting elements. In the present specification, when a plurality of light emitting elements are employed, the plurality of light emitting elements is determined as a group of light emitting elements, and the area dimension of the light-extraction surface of the group is determined as an area dimension of a rectangular region defined by straight line segments surrounding outer peripheries of the group of light emitting elements. Furthermore, in the figures, the first upper surfaces and the corresponding first lateral surfaces are illustrated connected by a straight line, but the first upper surfaces may be connected with the corresponding first lateral surfaces that are orthogonal to the first upper surfaces via curved surfaces. Such a curved surface can be formed by, for example, changing the machining depth of the blade of a tool used in the process in in the method of manufacturing wavelength converting member. In the description above, the first lateral surfaces of the wavelength converting members are illustrated orthogonal with respect to the first upper surfaces, but the first lateral surfaces may be formed inclined to define the recesses whose openings widening upward.

In the method of manufacturing the light emitting device(s) described above, the disposing a mask S11 have been illustrated, from a viewpoint that the mask used in the disposing a mask S1 is beneficial to clearly define the processing range of laser processing to form the second upper surface along one to four sides of the first upper surface, and the light emitting device(s) can be manufactured by performing the singulating S12, the disposing a light-shielding film S13, and the processing S15 in this order without the use of the mask(s). It is also possible to manufacture the light emitting device(s) by performing the disposing a light-shielding film S13, the singulating S12, and the processing S15 in this order without the use of the mask(s).

The light emitting device according to the present invention can be used for light source for the headlamps of vehicles such as motorcycles, automobiles, ships, aircrafts, and so on. The light emitting device according to the present invention can be used for various light sources for such as light sources for lighting, such as spotlights, light sources for display, and automotive parts.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   at least one light emitting element including a light-extracting surface and at least one lateral surface;
   a wavelength converting member comprising;
      a first upper surface and a second upper surface,
      a lower surface located at an opposite side from the first upper surface and the second upper surface,
      at least one first lateral surface connecting the second upper surface and the first upper surface, and
      at least one second lateral surface directly contacting and connecting the second upper surface and the lower surface, wherein
         a first thickness between the lower surface and the first upper surface is smaller than a second thickness between the lower surface and the second upper surface, and
         the first upper surface is located at an opposite side from the light-extracting surface of a corresponding one of the at least one light emitting element, and the lower surface is located facing the light-extracting surface of the corresponding one of the at least one light emitting element;
   a covering member covering the at least one second lateral surface of the wavelength converting member and the at least one lateral surface of the at least one light emitting element; and
   a light-shielding film covering the second upper surface of the wavelength converting member.

2. The light emitting device according to claim 1, wherein the wavelength converting member has a rectangular shape in a plan view, and the second upper surface is located at a periphery surrounding the first upper surface.

3. The light emitting device according to claim 1, wherein the wavelength converting member has a rectangular shape in a plan view, and the second upper surface is located at one side, two sides, or three sides of the rectangular shape.

4. The light emitting device according to claim 1, wherein the first upper surface has an area size smaller than an area size of the light extraction surface of the at least one light emitting element.

5. The light emitting device according to claim 1, wherein the at least one first lateral surface is orthogonal to the first upper surface.

6. The light emitting device according to claim 1, wherein the at least one first lateral surface includes a curved surface.

7. The light emitting device according to claim 1, wherein the at least one lateral surface is inclined with respect to the first upper surface.

8. The light emitting device according to claim 1, wherein the light-shielding film is disposed on the at least one second lateral surface and continuous onto the second upper surface, and
the covering member covers the wavelength converting member via the light-shielding film disposed on the at least one second lateral surface.

9. The light emitting device according to claim 1, wherein the covering member is disposed on the second upper surface via the light-shielding film.

10. The light emitting device according to claim 1, wherein a reflection-preventing film is disposed on the first upper surface.

11. The light emitting device according to claim 1, wherein the first upper surface has a roughened structure.

12. The light emitting device according to claim 1, wherein the light emitting device comprises a plurality of the light emitting elements and a plurality of the wavelength converting members disposed corresponding to the plurality of the light emitting elements.

13. The light emitting device according to claim 1, comprising a plurality of the light emitting elements, and a plurality of the wavelength converting member having a plurality of the first upper surfaces,
wherein the plurality of the light emitting elements are aligned to form a group of the light emitting elements, and
wherein the wavelength converting member is disposed in a rectangular shape along outer peripheral edges of the group of the plurality of light emitting elements and with a size that allows covering the group of the light emitting elements, and
with the plurality of the first upper surfaces having a rectangular shape in a plan view inward of outer peripheral edges of the plurality of the light emitting elements.

14. The light emitting device according to claim 1, wherein the wavelength converting member and the at least one light emitting element are bonded by an adhesive material.

15. The light emitting device according to claim 1, wherein the light-shielding film covers an entirety of the second upper surface of the wavelength converting member.

16. A light emitting device comprising:
at least one light emitting element including a light-extracting surface and at least one lateral surface;
a wavelength converting member comprising;
    a first upper surface and a second upper surface,
    a lower surface located at an opposite side from the first upper surface and the second upper surface,
    at least one first lateral surface connecting the second upper surface and the first upper surface, and
    at least one second lateral surface connecting the second upper surface and the lower surface, wherein
        a first thickness between the lower surface and the first upper surface is smaller than a second thickness between the lower surface and the second upper surface, and
        the first upper surface is located at an opposite side from the light-extracting surface of a corresponding one of the at least one light emitting element, and the lower surface is located facing the light-extracting surface of the corresponding one of the at least one light emitting element;
a covering member covering the at least one second lateral surface of the wavelength converting member and the at least one lateral surface of the at least one light emitting element; and
a light-shielding film covering the second upper surface of the wavelength converting member,
wherein the wavelength converting member has a rectangular shape in a plan view, and the second upper surface is located at a periphery surrounding the first upper surface.

17. A light emitting device comprising:
at least one light emitting element including a light-extracting surface and at least one lateral surface;
a wavelength converting member comprising;
    a first upper surface and a second upper surface,
    a lower surface located at an opposite side from the first upper surface and the second upper surface,
    at least one first lateral surface connecting the second upper surface and the first upper surface, and
    at least one second lateral surface connecting the second upper surface and the lower surface, wherein
        a first thickness between the lower surface and the first upper surface is smaller than a second thickness between the lower surface and the second upper surface, and
        the first upper surface is located at an opposite side from the light-extracting surface of a corresponding one of the at least one light emitting element, and the lower surface is located facing the light-extracting surface of the corresponding one of the at least one light emitting element;
a covering member covering the at least one second lateral surface of the wavelength converting member and the at least one lateral surface of the at least one light emitting element; and
a light-shielding film covering the second upper surface of the wavelength converting member,
wherein a reflection-preventing film is disposed on the first upper surface.

* * * * *